(12) United States Patent
Huff et al.

(10) Patent No.: US 7,045,440 B2
(45) Date of Patent: May 16, 2006

(54) METHOD OF FABRICATING RADIO FREQUENCY MICROELECTROMECHANICAL SYSTEMS (MEMS) DEVICES ON LOW-TEMPERATURE CO-FIRED CERAMIC (LTCC) SUBSTRATES

(75) Inventors: Michael A. Huff, Oakton, VA (US); Mehmet Ozgur, Reston, VA (US)

(73) Assignee: Corporation for National Research Initiatives, Reston, VA (US)

( * ) Notice: Subject to any disclaimer, the term of this patent is extended or adjusted under 35 U.S.C. 154(b) by 162 days.

(21) Appl. No.: 10/663,986

(22) Filed: Sep. 17, 2003

(65) Prior Publication Data
US 2005/0167047 A1  Aug. 4, 2005

Related U.S. Application Data

(62) Division of application No. 10/147,907, filed on May 20, 2002, now Pat. No. 6,815,739.

(60) Provisional application No. 60/291,647, filed on May 18, 2001.

(51) Int. Cl.
*H01L 21/46* (2006.01)
*H01L 21/50* (2006.01)

(52) U.S. Cl. .................. 438/456; 438/107; 438/126; 257/703; 257/724; 333/250; 333/258; 333/262; 343/700

(58) Field of Classification Search ................. 29/830, 29/832, 840, 846, 854; 333/185, 246, 247, 333/249, 250, 256, 258, 259, 262, 263; 336/200, 336/232; 343/707 MS; 361/761, 762, 763, 361/764, 780, 784, 792, 793, 794, 795, 803; 257/275, 415, 664, 703, 704, 724, 728, 798; 438/107, 118, 125, 126, 455, 456
See application file for complete search history.

(56) References Cited

U.S. PATENT DOCUMENTS

| | | | |
|---|---|---|---|
| 5,472,539 A | 12/1995 | Saia et al. |
| 5,479,042 A | 12/1995 | James et al. |
| 5,644,327 A | 7/1997 | Onyskevych et al. |
| 6,025,767 A | 2/2000 | Kellam et al. |
| 6,154,176 A | 11/2000 | Fathy et al. |
| 6,195,047 B1 | 2/2001 | Richards |

(Continued)

OTHER PUBLICATIONS

PCT Search Report for International Application No. PCT/US02/15602.

*Primary Examiner*—Amir Zarabian
*Assistant Examiner*—Pamela E Perkins
(74) *Attorney, Agent, or Firm*—Nixon & Vanderhye P.C.

(57) ABSTRACT

A phased-array antenna system and other types of radio frequency (RF) devices and systems using microelectromechanical switches ("MEMS") and low-temperature co-fired ceramic ("LTCC") technology and a method of fabricating such phased-array antenna system and other types of radio frequency (RF) devices are disclosed. Each antenna or other type of device includes at least two multilayer ceramic modules and a MEMS device fabricated on one of the modules. Once fabrication of the MEMS device is completed, the two ceramic modules are bonded together, hermetically sealing the MEMS device, as well as allowing electrical connections between all device layers. The bottom ceramic module has also cavities at the backside for mounting integrated circuits. The internal layers are formed using conducting, resistive and high-k dielectric pastes available in standard LTCC fabrication and low-loss dielectric LTCC tape materials.

97 Claims, 19 Drawing Sheets

U.S. PATENT DOCUMENTS

| | | |
|---|---|---|
| 6,219,254 B1 | 4/2001 | Akerling et al. |
| 6,225,692 B1 * | 5/2001 | Hinds .................. 257/698 |
| 6,347,237 B1 | 2/2002 | Eden et al. |
| 6,456,172 B1 | 9/2002 | Ishizaki et al. |
| 6,538,312 B1 | 3/2003 | Peterson et al. |
| 6,694,583 B1 | 2/2004 | Branchevsky |
| 6,738,600 B1 | 5/2004 | Newton et al. |
| 2002/0075651 A1 | 6/2002 | Newton et al. |
| 2002/0085334 A1 | 7/2002 | Figueroa et al. |
| 2003/0042567 A1 | 3/2003 | Tilmans et al. |
| 2003/0047799 A1 | 3/2003 | Cheever et al. |
| 2003/0151476 A1 | 8/2003 | Salmela et al. |

* cited by examiner

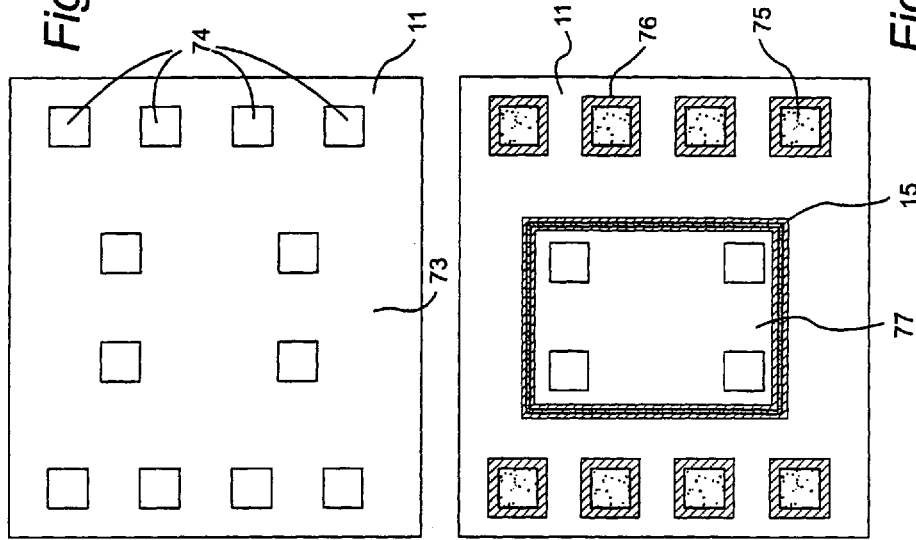
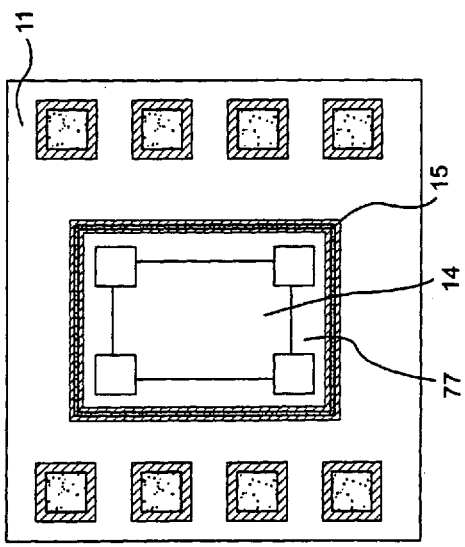
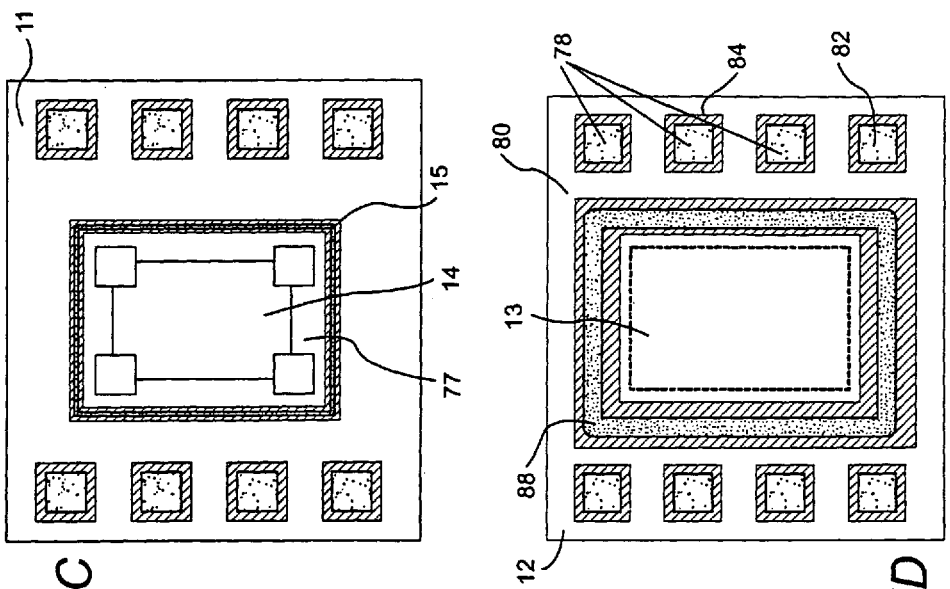

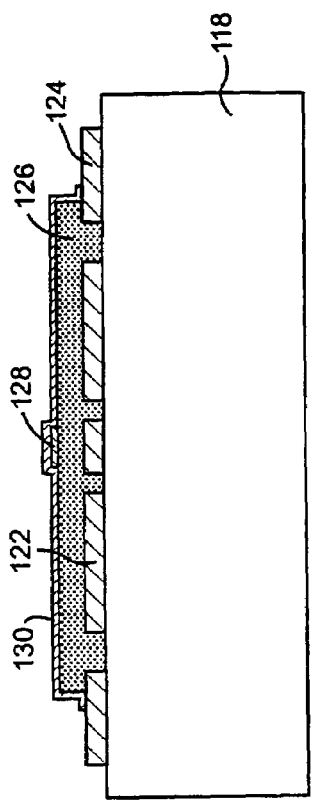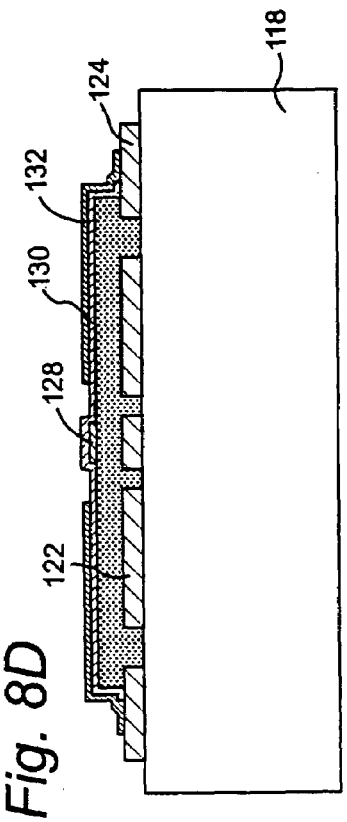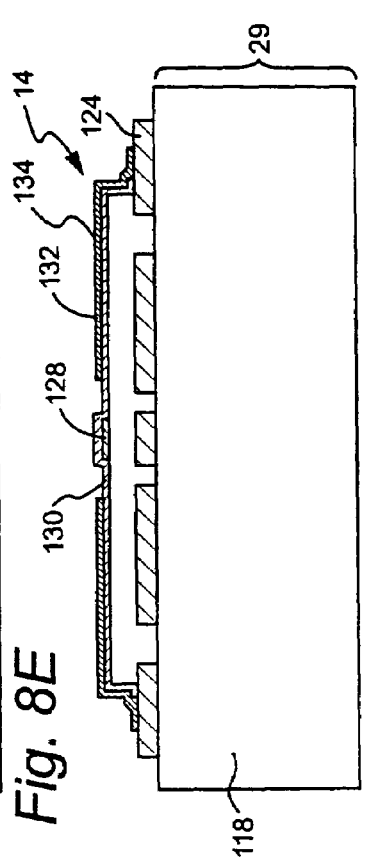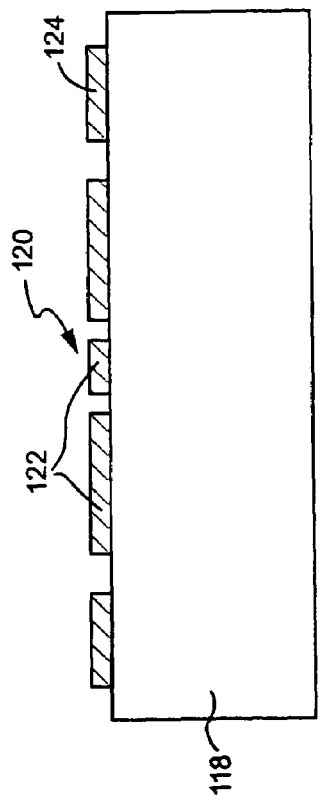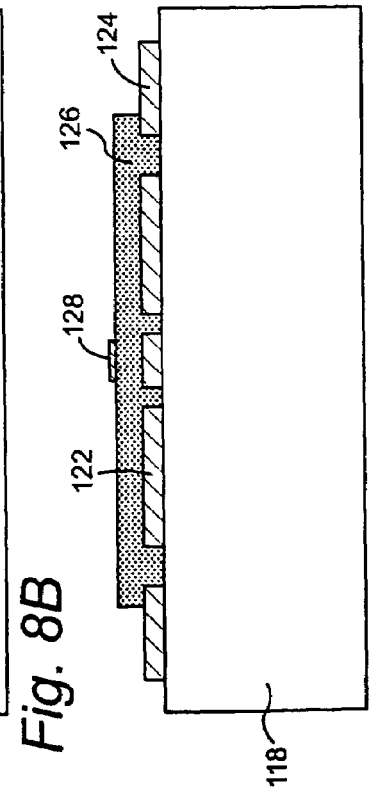

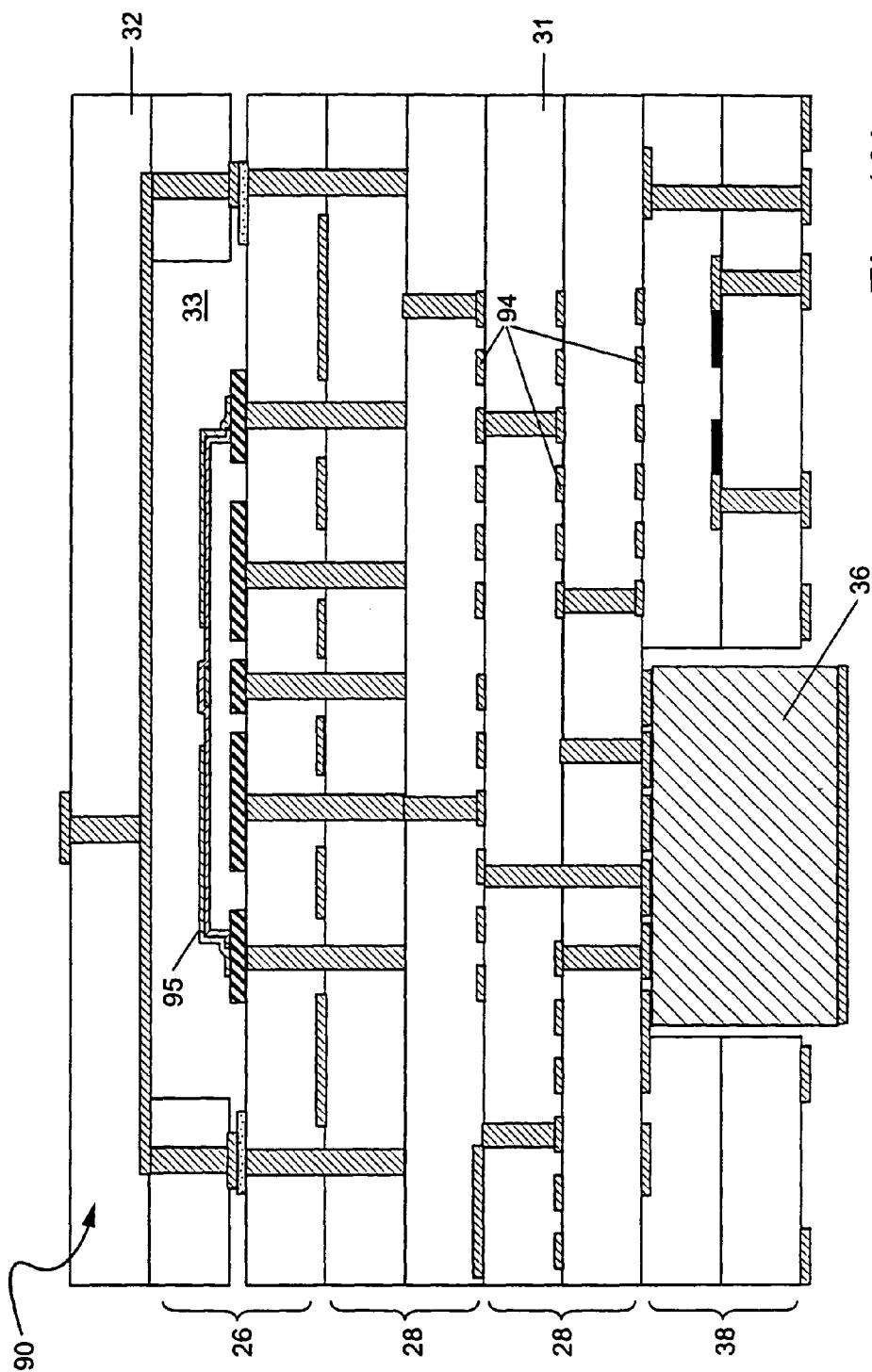

METHOD OF FABRICATING RADIO FREQUENCY MICROELECTROMECHANICAL SYSTEMS (MEMS) DEVICES ON LOW-TEMPERATURE CO-FIRED CERAMIC (LTCC) SUBSTRATES

This application is a divisional of application Ser. No. 10/147,907, filed May 20, 2002, now U.S. Pat. No. 6,815,739 which claims the benefit of Provisional Application No. 60/291,647, filed May 18, 2001, the entire contents of which are hereby incorporated by reference in this application.

FIELD OF THE INVENTION

The present invention relates to Radio Frequency (RF) Micro-electromechanical systems (MEMS) and devices that are fabricated on or within Low-Temperature Co-Fired Ceramic ("LTCC") substrates. The present invention also relates to a method of fabricating, integrating and packaging such MEMS RF devices and systems using MEMS and LTCC technologies.

BACKGROUND OF THE INVENTION

Microelectromechanical systems (MEMS) have been shown to be useful for a variety of consumer, industrial and military applications. Most MEMS devices are fabricated on semiconductor substrates (e.g., silicon, Gallium Arsenide, Silicon-On-Insulator, etc.) using standard Integrated Circuit (IC) processes in combination with specialized micromachining processes. Collectively these manufacturing technologies are frequently called microfabrication processes.

Conventional MEMS processes which are performed on silicon or other semiconductor substrates can lower the cost of products, but not to the extent required for many consumer or industrial applications. Typically, MEMS devices are batch fabricated, either as discrete components or directly on or within integrated circuits ("IC") as a part of a merged MEMS-IC process. Although both approaches can potentially lower cost somewhat, the reduction is not sufficient for many applications. Even if a sufficiently low cost process for the fabrication a MEMS device can be achieved, the manufacturing of MEMS devices can incur significant additional costs associated with packaging and integration, resulting in an expensive overall system or product cost. The fabrication of MEMS devices directly on or within integrated circuits ("integrated MEMS") requires expensive process development as well as some compromises in device performance. Both approaches are also limited by total processing area, and the resultant gains from these approaches are modest at best. Consequently, one of the key limitations of MEMS technology has been the cost of manufacturing MEMS devices and systems using semiconductor substrates and microfabrication process technologies. Another limitation relates to the high cost associated with packaging these devices and systems. Yet another limitation relates to the cost and difficulty of realizing systems wherein MEMS and microelectronics are combined into modules or integrated together to form functional systems. Therefore, there is a tremendous need for more functional and cost-effective fabrication, packaging and integration techniques for implementation of MEMS-based RF devices.

Recently there has been a large interest in making MEMS Radio Frequency (RF) devices and systems for a variety of high volume communication applications. Although MEMS-based RF components and systems have been demonstrated, all have been realized on traditional semiconductor materials, primarily silicon wafers. While this approach works for the demonstration of a device, it has several severe disadvantages for the performance and potential commercialization of RF and microwave devices. First, the dielectric losses of the silicon substrate are very high at frequencies above 1 GHz. Second, the cost of silicon substrates and processes used to fabricate MEMS RF devices on these substrates are too high compared to existing technologies. Third, the packaging costs of silicon and other semiconductor material based MEMS devices are very high, particularly for devices that must operate at high frequencies and under extreme environmental conditions.

While the losses of the silicon substrate can be reduced appreciably by selectively removing the silicon from under the active devices and the associated signal paths using an isotropic etchant, such as Xenon Diflouride (XeF2), this is an expensive process and one that is not readily compatible with the fabrication of active MEMS devices. Consequently, the resultant manufacturing yield will be low and the cost will increase appreciably. Other semiconductor substrates having lower dielectric losses can be employed for the fabrication of MEMS devices, such as Gallium Arsenide (GaAs), resulting in high performance devices. However, the cost of these materials and the costs to fabricate devices on these materials are typically two orders of magnitude higher than even silicon wafers and processes. Consequently, the resultant device or system cost will be far too high for many consumer or industrial applications. Furthermore, any semiconductor based MEMS device will require a separate packaging technology that will need to be specifically developed to meet the demanding requirements of a commercial product. Packaging techniques that can meet the required specifications and simultaneously provide a sufficiently low cost have not been readily available in the past.

Nevertheless, there is enormous opportunity for MEMS technology in the application of RF and microwave devices and systems. If the cost and performance goals can be met, the potential market sizes for these devices will be enormous. However, in order to exploit this opportunity, there is a need for a new low-cost material that has low dielectric losses at high frequencies and onto which MEMS devices can be successfully fabricated with high yield. Furthermore, there is a need for the capability to suitably and inexpensively integrate these MEMS devices with other MEMS device and components to form functional systems. There is also a need to suitably and inexpensively package MEMS devices and systems. It is useful to elaborate in some detail about specific RF and microwave MEMS devices and systems that can greatly benefit from fabrication, packaging and integration that can be performed on a low-cost low dielectric loss material.

MEMS Radio Frequency (RF) switches have been shown to have very low dielectric losses at very high frequencies, if fabricated on specialized substrate materials such as GaAs. Compared to traditional active microwave switches (based on active components such as transistors or diodes), the quality factors (where the quality factor is given by $1/R_{on} C_{off}$, where $R_{on}$ is the resistance of the switch in the ON-state and $C_{off}$ is the OFF-state capacitance of the switch) of these MEMS RF switches are very high. Therefore, MEMS RF switch components have the potential for use in many types of applications. However, these devices have been limited due to the extremely high cost of fabricating and packaging the MEMS switches on Gallium-Arsenide substrates.

An important application of MEMS switches is as phase-shifters in phased-array antennas. Traditionally, phase-shifters for phased-array antennas have been implemented using active electronic components (e.g., transistors, diodes, etc.) made from exotic and expensive materials such as Gallium-Arsenide (GaAs). Typically, even at high volume production, GaAs-based active phase-shifters can cost more than 100 times to fabricate and are more than twice as lossy as MEMS phase-shifters. As a result, phase-shifters are the main cost driver in phased-array antennas. If active electronic GaAs phase-shifters are employed, about 45% of the overall cost of a receiver antenna system can be attributed to the phase-shifters alone. This is attributed to the high fabrication cost for such devices and the additional cost associated with the amplification and thermal management required by their high losses at their operational frequencies. Consequently, due to the high cost, active electronic GaAs-based phase-shifters have been limited to use in military array antennas.

For similar reasons, a variety of other MEMS RF components and systems, including: electronically-tunable variable capacitors, closed-loop controlled variable capacitors, tunable inductors, tunable LC filters, tunable LC networks, reconfigurable RF antennas, phased array antennas, as well as combinations of the above MEMS devices and systems, would greatly benefit from the ability to be fabricated on a low-cost, low dielectric loss material. Furthermore, these devices and systems would also benefit from low-cost and high performance approach for packaging and integration.

Recent developments in Low Temperature Co-Fired Ceramic (LTCC) processing, combined with the recent availability of new high-quality LTCC substrate materials having low dielectric losses at high frequencies, have made it possible to fabricate, integrate and package RF MEMS devices and systems with high performance and at low costs.

Direct fabrication of MEMS RF components onto LTCC substrates is key to reducing the cost of these systems, while simultaneously achieving high functional performance. The use of LTCC substrates and processing techniques to integrate and/or package MEMS RF devices also provides many advantages. The cost to attempt to integrate different types of MEMS RF devices together or with microelectronics is enormous. This is because the processing steps used to fabricated the merged devices or systems greatly influence material properties and resultant device performance. Using LTCC as a substrate material greatly simplifies and lowers the cost of integration.

With respect to packaging, it is frequently the case that the cost of packaging MEMS devices is more than the cost of the MEMS device itself. This is because the package must be specifically designed and manufactured for each individual MEMS device type. Furthermore, the package must protect the MEMS device from the environment, but simultaneously allow the MEMS device to interact with the environment. The use of LTCC as a substrate material that can provide electrical connections through layers, as well as methods to make MEMS directly on the LTCC material, and methods to affixed semiconductor substrates with high quality electrical connections to the activated components, while also providing suitable packaging protection, and at low cost, is a significant improvement in MEMS technology.

The present invention, which uses MEMS RF devices fabricated on a LTCC substrate, allows the cost and difficulty of realizing a system to be dramatically reduced so that MEMS RF devices can be more broadly used for consumer and industrial applications. The present invention, which uses an LTCC substrate with electrical connections across or through multiple layers of the LTCC substrate, and when bonded or affixed to MEMS on LTCC substrates or other substrates such as semiconductor ICs, enables the device or system to be integrated and packaged with a significant reduction in cost so that products based on MEMS technology can be used more broadly for consumer and industrial applications.

The present invention, which uses MEMS RF switches fabricated on an LTCC substrate, allows the cost of MEMS RF switches to be dramatically reduced while maintaining excellent RF performance, so that they can be used more broadly for mobile wireless communication systems, including broadband satellite communications and broadband cellular communications, and thereby be available for use by a wide consumer base.

The present invention, which uses any single or combination of MEMS components, including: electronically-tunable variable capacitors, closed-loop controlled variable capacitors, tunable inductors, tunable LC filters, tunable LC networks, fabricated on an LTCC substrate, allows the cost of MEMS devices to be dramatically reduced while simultaneously achieving high performance and functionality so that these devices and systems can be more broadly used for mobile wireless communication systems, broadband satellite communications or broadband cellular communications, and thereby be available for use by a wide consumer base.

The present invention, which uses MEMS RF switches and/or phase shifters fabricated on an LTCC substrate, allows the cost of phased-array antennas to be dramatically reduced so that phased-array antennas can be more broadly used for mobile wireless communication systems, including broadband satellite communications and broadband cellular communications, and thereby be available for use by a wide consumer base.

Furthermore, the present invention also enables the fabrication and packaging of other micromechanical and microelectronic components, either discrete or integrated, onto substrate materials which have high-performance characteristics at elevated operational frequencies and low-cost.

SUMMARY OF THE INVENTION

An object of the present invention is to provide integrated MEMS RF devices, RF switches, and phase shifters fabricated on and/or packaged within low-cost Low-Temperature Co-Fired Ceramic (LTCC) substrates.

Another object of the present invention is to provide integrated and packaged MEMS tunable inductors; electronically tunable variable inductors; closed-loop controlled electronically tunable variable inductors; RF switches; electronically-controllable phase-shifters, variable capacitors; electronically tunable variable capacitors; closed-loop controlled electronically tunable variable capacitors; fabricated on and/or packaged with low-cost LTCC substrates.

A further object of the present invention is to provide an integrated, low-cost and highly functional, high-performance, high-gain phased-array antenna using MEMS phase-shifters and other microfabricated electrical and microwave components combined with LTCC substrates.

Another object of the present invention is to provide a method for fabricating phased-array antenna modules that can be subsequently tiled together with a number of indentical antenna modules to form an entire phased-array antenna system.

Another object of the present invention is to provide an entire integrated, highly-functional, high-gain phased-array antenna system composed of micromechanical, microelectronic and microwave components on a large low-cost and low-dielectric loss LTCC substrate material.

Yet another object of the present invention is to provide a process for manufacturing high-performance and high quality MEMS devices and other electronic and microwave components on LTCC substrate materials.

Another object of the present invention is to provide a process for manufacturing high-performance and high quality MEMS devices and other electronic and microwave components onto multiply layered LTCC substrate materials enabling efficient electrical connection between the conduction lines and components on individual layers.

Another object of the present invention is to reduce the manufacturing cost of high-gain phased-array antennas.

A further object of the present invention is to provide a method of efficiently integrating and packaging MEMS devices and other functional components, such as microelectronic and microwave devices including: MEMS tunable inductors; electronically tunable variable inductors; closed-loop controlled electronically tunable variable inductors; electronically-controllable phase-shifters; RF switches; variable capacitors; electronically tunable variable capacitors; closed-loop controlled electronically tunable variable capacitors; within suitably patterned and adjoined multiply-layered LTCC substrates.

A further object of the present invention is to provide a method of efficiently packaging MEMS device in LTCC modules on which other integrated circuits can be mounted to form the phased-array antenna of the present invention.

Yet another object of the present invention is to provide a very low cost and effective means of batch fabricating individual discrete or integrated MEMS, microelectronic, and microwave components such as MEMS tunable inductors; electronically tunable variable inductors; closed-loop controlled electronically tunable variable inductors; electronically-controllable phase-shifters, RF switches, variable capacitors; electronically tunable variable capacitors; closed-loop controlled electronically tunable variable capacitors; on LTCC substrate materials as well as providing a packages for these components from suitably patterned and adjoined multiply-layered LTCC substrates.

Yet another object of the present invention is to provide very cost effective packaging of MEMS devices in LTCC modules for applications other than array antennas.

The present invention is directed to the embodiment of MEMS devices onto or within LTCC substrates and the embodiment of discrete MEMS RF, electronic, and microwave components onto LTCC substrates.

The present invention is also directed to an integrated, low-cost and highly functional, high-gain MEMS-based phased-array antenna that can be tiled together with a number of antenna modules to form an entire phased-array antenna system and that can be made from suitably adjoining a multiplicity of large LTCC substrate materials. The present invention is also directed to an improved method of manufacturing the MEMS-based LTCC antenna and other devices that use MEMS and LTCC technology and to the packaging of discrete MEMS, electronic, and microwave components within suitably patterned and adjoined multiply layered LTCC substrates.

The device or system of the present invention is a multi-layered structure, which contains a number of passive and active elements, some of which are MEMS devices, which are preferably fabricated onto suitably patterned and adjoined multiple layered stack of LTCC substrates.

In yet another embodiment of the present invention, discrete MEMS, microelectronic and microwave components, such as MEMS tunable inductors; electronically tunable variable inductors; closed-loop controlled electronically tunable variable inductors; electronically-controllable phase-shifters; RF switches; variable capacitors; electronically tunable variable capacitors; closed-loop controlled electronically tunable variable capacitors; and other components commonly used in the implementation of high frequency devices and systems, are batch fabricated and packaged onto and within a suitably patterned and adjoined multiple layered stack of LTCC substrates. The discrete components can be separated from the substrates using any of the well known and established methods of die separation such as diesawing.

In yet another embodiment of the present invention a phased-array antenna is a multi-layered structure, which contains a sub-array of wide-band radiating patches, a corresponding number of digital phase shifters, a power divider (or combiner) network, and a band pass filter at the input (or output) of the antenna. The antenna layers preferably use LTCC material as a dielectric substrate and the various circuit components formed by the different layers are integrated together via vertical interconnects. This level of integration and the use of LTCC material results in a rugged and power efficient antenna, which allows a significant reduction in the cost of phased-array antenna systems, while improving the overall performance of such systems. The modularity of one embodiment of the design greatly simplifies the integration of the large phased-array that can be assembled using the antenna modules of the present invention as its building blocks. Similar designs are employed for the transmitting and receiving antennas.

Alternatively, the entire antenna system can also be implemented using a multiplicity of suitably patterned and adjoined large sheets of LTCC material unto which the various components are fabricated to embody a complete and functional phased-array antenna system. In yet another embodiment of the present invention, micromechanical and microelectronic components, either discrete or integrated onto substrate materials which have high-performance characteristics at elevated operational frequencies, are fabricated, integrated and packaged on LTCC substrates.

According to the method of the present invention, the use of large LTCC wafers or panels, without compromising processing capability or speed, lowers the cost of fabrication dramatically. Panels as large as 1×1 m can be manufactured in LTCC lines, as compared to 0.3 m diameter wafers used in state-of-the-art semiconductor IC foundries. Moreover, the tools and fabrication methods needed to process large LTCC panels are not as expensive as those needed to process semiconductor wafers, since the minimum size of patterned features, such as conducting strips and via holes, is more than 25 μm. The savings on the tool costs and the fabrication of significantly more devices for the equivalent effort and cost yields very low-cost fabrication.

Alternatively, LTCC substrates can be embodied in the form of wafer sizes and dimensions standard to the semiconductor processing industry and equipment set, thereby allowing the fabrication of high-performance devices and systems on the existing semiconductor processing equipment base.

The method of the present invention also does not require separate packaging and integration steps for the MEMS components. In the present invention, a multiplicity of suitably patterned LTCC material layers are stacked or adjoined together and used as substrates onto which are fabricated high-performance MEMS components that are required to build high frequency devices and systems including: MEMS tunable inductors; electronically tunable variable inductors; closed-loop controlled electronically tunable variable inductors; electronically-controllable phase-shifters; RF switches; variable capacitors; electronically tunable variable capacitors; closed-loop controlled electronically tunable variable capacitors; and other components commonly used in the implementation of high frequency devices and systems.

Alternatively, a variety of MEMS devices and other components, some of which are fabricated directly onto the LTCC systems, others of which are made on other substrates such as microelectronics die, can be integrated with the LTCC layers to build a phased-array antenna, or other high frequency devices and systems.

These components that can be fabricated on the LTCC substrates for the embodiment of RF systems or phased-array antennas including, for example, transmission lines, couplers, dividers, filters and radiating patches.

Providing the vertical connections between layers necessary for an array antenna, a discrete MEMS component, or an array of MEMS components, is straightforward and efficient in an LTCC process, whether on a panel, sheet or wafer shaped substrate, in comparison to standard semiconductor processes using conventional substrate materials, and where such connections are extremely difficult and expensive.

According to the method of the present invention, two or more multilayer ceramic modules or substrates are formed using a standard LTCC process are combined with microfabrication processes as part of the present invention. After appropriate surface preparation on one of the modules or substrates, MEMS devices are formed on the frontside of that module or substrate. Next, the two ceramic modules or substrates are bonded or adjoined together, forming a hermetically sealed cavity in which the MEMS devices are located. The bonding is preferably performed in a controlled environment to modify and improve the operation of the MEMS devices. Finally, various types of ICs can be flip-chip bonded or wire bonded to the backside of the module on which the MEMS devices are fabricated. These ICs can also be packaged by bonding or adjoining two or more modules or substrates to form a sealed cavity. At this step, if necessary, thermal spreaders are then mounted on the ICs. It should be obvious to those skilled in the are that this method can be extended as a low-cost and efficient method to package a variety of other high frequency micromechanical, electronic and microwave components and systems. Efficient electrical connections between components and systems located on different layers of the stack of multiple layers are enabled with this method.

From the point of view of MEMS fabrication, for an embodiment of a phased array antenna, one or more ceramic modules are the substrates on which the MEMS devices are fabricated, and the other modules are the top cover of a hermetically sealed cavity containing the MEMS devices. From the point of view of the phased-array antenna, the layer of MEMS devices is only one of many device layers that make up the overall architecture of the antenna. The layer with the MEMS devices (and corresponding transmission lines) is referred as the phase-shifter layer. The other ceramic layers that form the ceramic modules are used to form circuits, such as power dividers or combiners, filters, couplers, polarizers, etc. Finally, for semiconductor Ics, the ceramic modules can also serve as the integration and packaging medium.

The phased array antenna and phase-shifter combination of the present invention results in a design in which there are many antenna radiating elements with slight phase-shifts with respect to each other, thereby allowing the use of an electronically scanable beam without mechanically changing the position of the phased array antenna.

The present invention also results in an extremely low-cost method for batch fabricating and packaging discrete MEMS, electronic and microwave components. The present invention also results in an extremely low-cost method for batch fabricating and packaging discrete MEMS RF switches and integrated MEMS phase-shifters.

The present invention also results in an extremely low-cost method for batch fabricating and packaging integrated MEMS tunable inductors; electronically tunable variable inductors; closed-loop controlled electronically tunable variable inductors; RF switches; electronically-controllable phase-shifters, variable capacitors; electronically tunable variable capacitors; and closed-loop controlled electronically tunable variable capacitors, as well as combinations of the above devices.

The present invention also results in an extremely low-cost method for batch fabricating and packaging integrated phased-array antennas, and, in particular, integrated phased-array antennas that can be subsequently tiled together with a number of identical antenna modules to form an entire phased-array antenna system.

The present invention also results in an extremely low-cost method for batch fabricating and packaging high quality MEMS devices and other electronic and microwave components on LTCC substrate materials.

The present invention is directed to the embodiment of MEMS devices and systems, in particular RF MEMS devices and systems onto or within LTCC substrates. The present invention is also directed to the embodiment of discrete MEMS, electronic, and microwave components onto LTCC substrates.

BRIEF DESCRIPTION OF THE DRAWINGS

FIGS. 7A–7D illustrate the process for hermetically packaging the MEMS devices.

FIGS. 8A–8F show a traditional MEMS process flow that can also be used with the present MEMS device or system invention.

FIG. 10B is a cross-sectional view of the tunable (switched) inductor.

DESCRIPTION OF THE PREFERRED EMBODIMENTS

Figure 1:
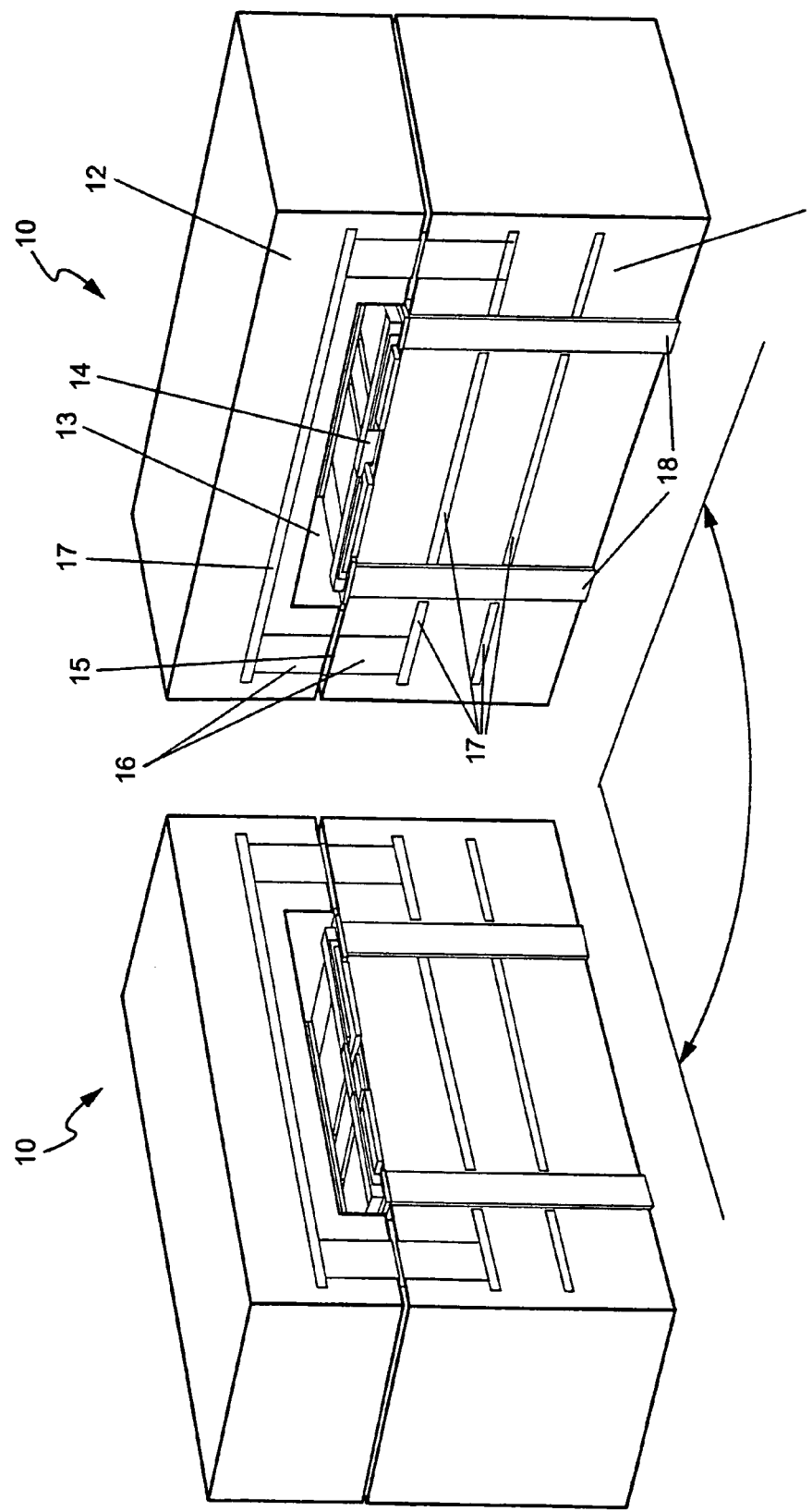
FIG. 1 shows two perspective views of a preferred embodiment of a generalized MEMS device or system of the present invention fabricated on and packaged within a stack of multiple layers of LTCC material, where the device or system has been sliced open to show its internal structure.

FIG. 1 shows two perspective views of a sliced open generalized MEMS RF device or system ("module") 10 fabricated on a stack of multiple layers of an LTCC material which serve as a substrate 11 for a fabricated MEMS RF device 14. FIG. 1 also illustrates the packaging of the MEMS RF device wherein a cavity 13 is formed in a stack of LTCC layers 22 which are mated together to form a second substrate 12. The two substrates are then bonded or affixed together so as to enclose the MEMS RF device 14 within the cavity formed 13 in the upper LTCC substrate 12 prior to bonding the two LTCC substrates together to form device 10.

Figure 2:
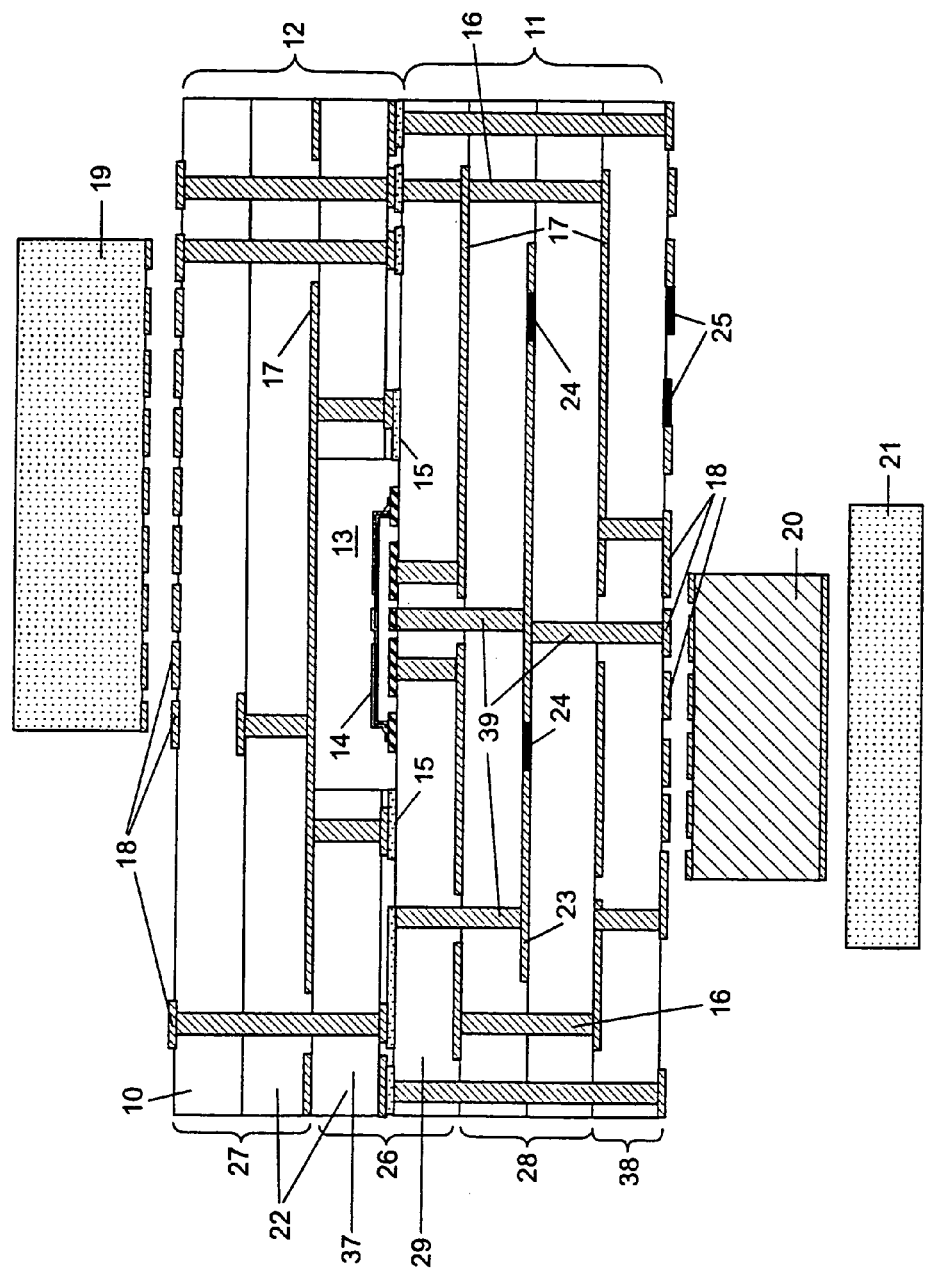
FIG. 2 is a cross-sectional view of the preferred embodiment of a generalized MEMS device or system fabricated on and packaged within a stack of multiple layers of LTCC material, which shows electrical connections through the stack of layers of the LTCC material and the integration of an IC substrate with the MEMS on LTCC substrates to make a functional system.

FIG. 2 illustrates a cross-sectional view of the preferred embodiment of a single generalized MEMS RF device 10 fabricated on a stack of multiple layers of LTCC material 22 and demonstrates the ability of providing suitable electrical connections 16 and 39 through a multiplicity of layers of the LTCC substrate 11 as well as the ability to form electrical connection paths 17 and 23 and passive or active components 24 and 25 on the substrates, thereby achieving an efficient and cost effective means to integrate and package MEMS RF devices.

Figure 3:
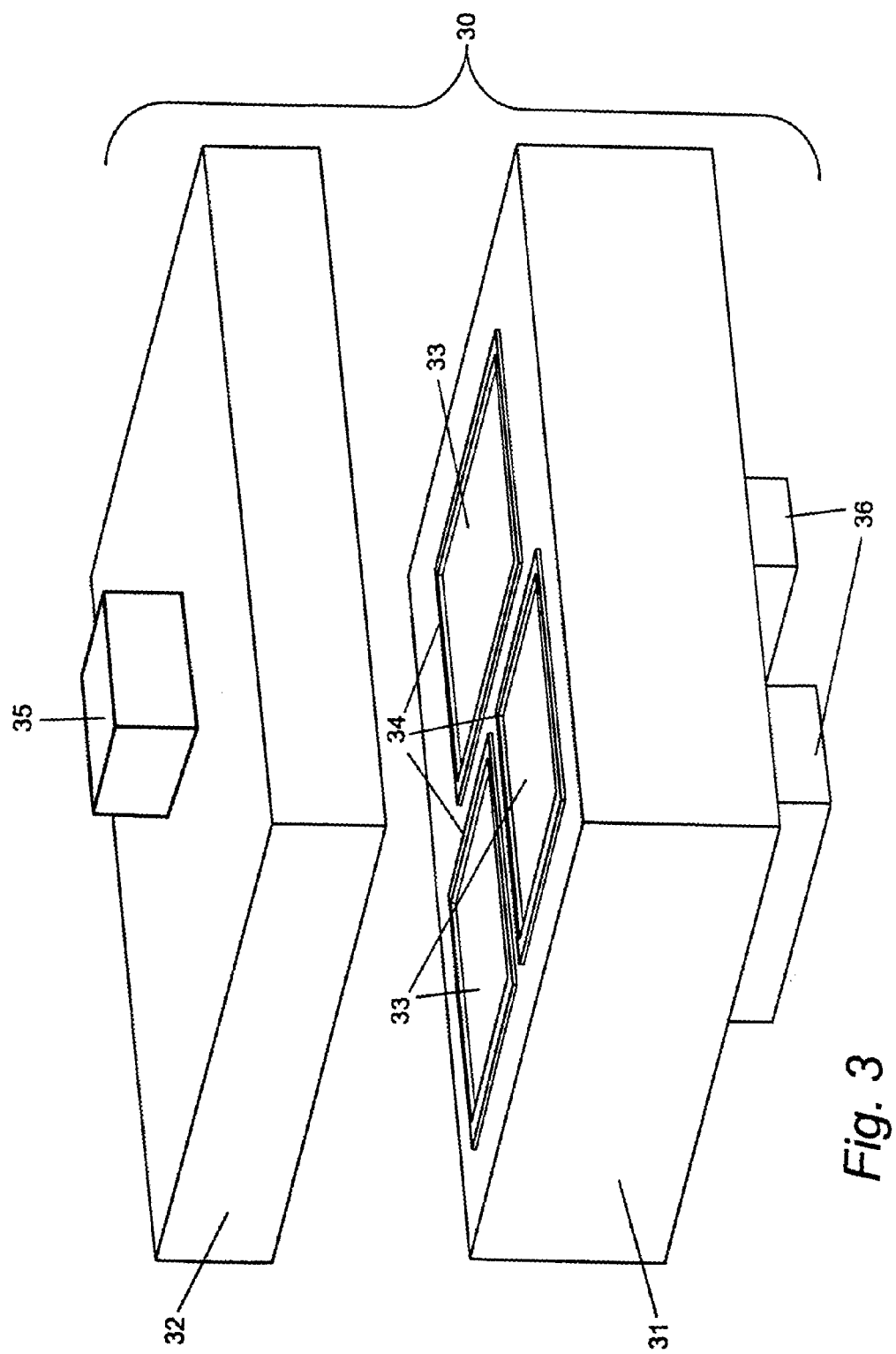
FIG. 3 is a perspective view of the preferred embodiment of a generalized MEMS device or system fabricated on and packaged within a stack of multiple layers of LTCC material which encloses multiple MEMS devices with the two LTCC modules being separated for ease in understanding the configuration.

FIG. 3 shows a perspective view of a multiplicity of generalized MEMS RF devices 33 formed simultaneously on an LTCC substrate 31 (i.e., batch fabricated). It should be obvious to those skilled in the art that a multiplicity of MEMS RF devices or systems can be fabricated, integrated and packaged simultaneously, using so-called batch fabrication methods whereby the processing costs for a substrate are distributed over the number of working components on the same substrate or module.

Referring to FIG. 2, the MEMS RF devices 14 comprising the MEMS system 10 of the present invention are enclosed within two multilayer LTCC modules 11 and 12, the layers of which form various system components, including at least one MEMS RF device 14, a packaging cavity 13, and horizontal and vertical interconnects 16 and 39. The preferred dielectric medium for implementing these components is a low-temperature co-fired ceramic, or LTCC, which allows multilayer processing, and thus facilitates the vertical integration and multilevel electrical connection of the component layers and devices at the processing stage.

Although LTCC is the preferred dielectric medium for the present invention, it is also possible to use high temperature co-fired ceramic ("HTCC") for the dielectric medium. The number of MEMS RF devices and electrical elements in each device or module 33 (in FIG. 3) depends on the frequency, performance, maximum package size, and system, processing steps and power distribution requirements of the system. The level of integration depends on the size and complexity of the MEMS RF system requirements.

Device 10 (FIG. 2) includes at least one MEMS-based RF element 14 that is fabricated on LTCC module 11. Minimization of the die area is very important to lower the cost of the overall system, since the packaged MEMS RF devices are typically the most expensive component of such a system.

The vertical integration benefits of LTCC technology and the high-performance of MEMS RF devices are crucial for achieving the low-cost high-performance RF devices 10 of the present invention. Despite recent developments in LTCC processing (for example, photolithographic patterning of conductor/dielectric layers, zero-shrink processes that lower the shrinkage in the X-Y plane more than one order of magnitude, and various new dielectric and magnetic layers) the preferred design flow of the present invention employs only techniques currently available in the mainstream of LTCC processing. However, use of the recent developments in LTCC processing can increase dimensional control and device density, and decrease the volume and reduce the cost of fabrication even further.

Figure 4:
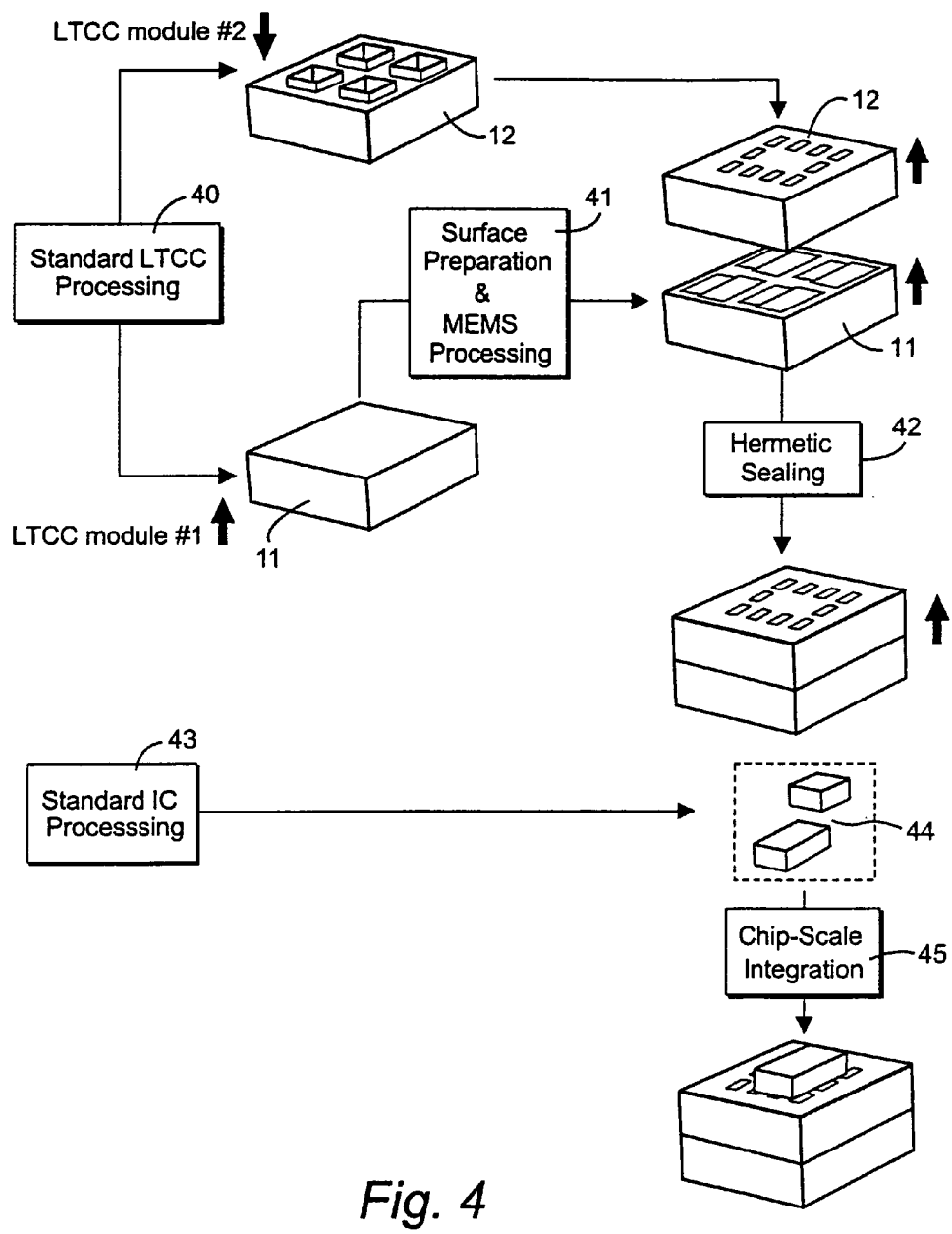
FIG. 4 illustrates a process flow for making the generalized MEMS system of the present invention using LTCC materials.
Figure 5:
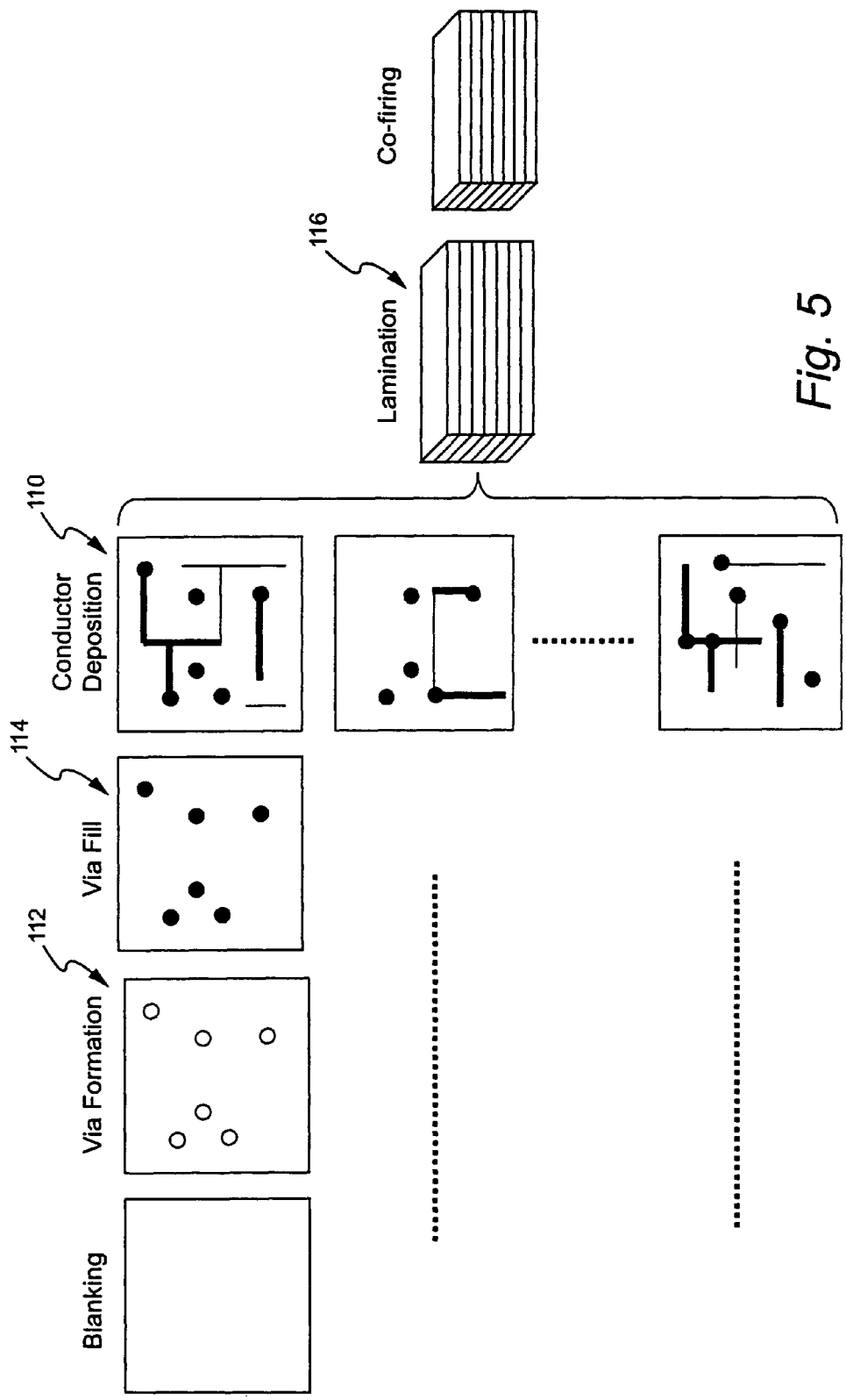
FIG. 5 illustrates the process flow for standard LTCC fabrication.
Figure 6A:
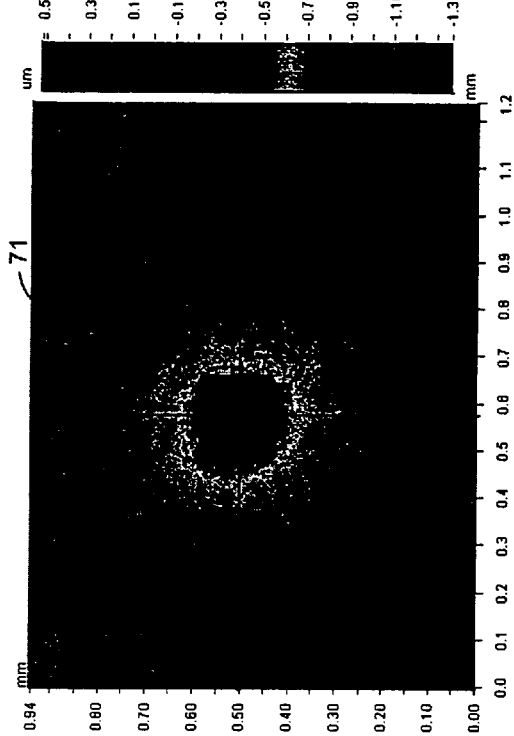
FIGS. 6A–6D are graphs showing non-contact surface measurements of a multilayer ceramic substrate with a through-wafer gold via after mechanical polishing.
Figure 6B:
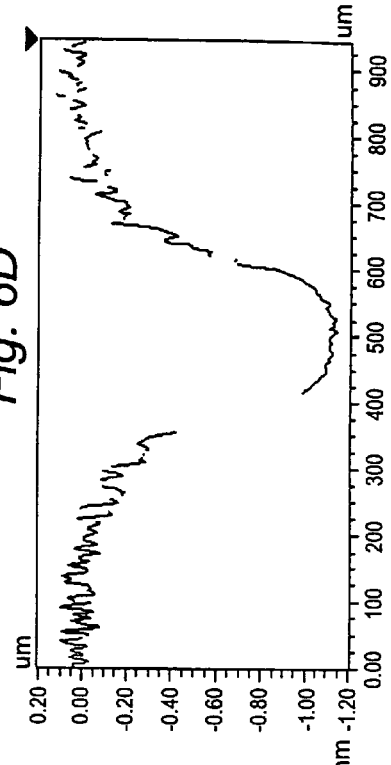
Figure 6C:
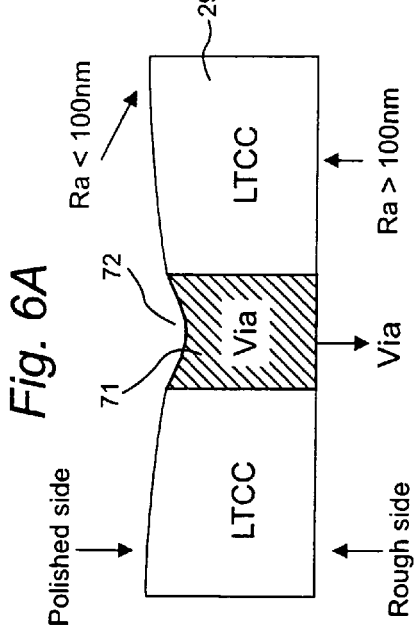
Figure 6D:
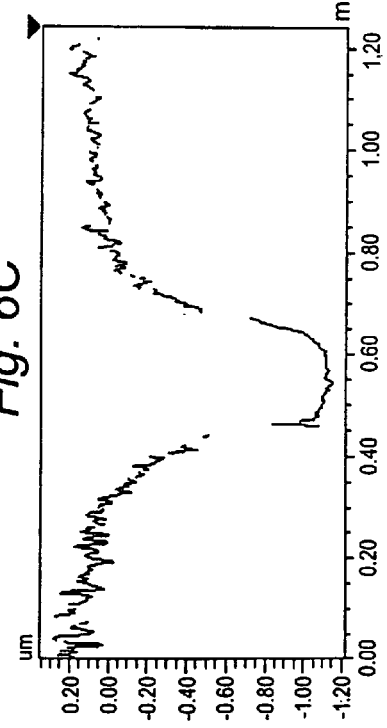

The process used to make each MEMS RF device 14 of system 10 is generally shown in FIG. 4. According to the process of the present invention, the two multilayer ceramic substrates 11 and 12 are formed using a standard LTCC process 40. The standard LTCC process flow is illustrated in FIG. 5. After the surface preparation on the substrate 11, MEMS components are formed on the frontside of the module as shown at step 41 in FIG. 4. Next, at step 42, the LTCC substrates 11 and 12 are bonded, forming hermetically sealed cavities 13, in which the MEMS components 14 are located. The bonding of substrates 11 and 12 can be performed in a controlled environment to achieve the hermetically sealed cavity 13: Operation in this sealed cavity improves the operation of MEMS devices 14.

From the point of view of MEMS fabrication, LTCC substrate 11 is the substrate on which MEMS RF devices 14 are fabricated, and the other LTCC substrate 12 is the top cover of the hermetically sealed cavity 13 formed by the bonding of substrates 11 and 12. From the point of view of the module or package, the layer 26 that contains the MEMS RF components 14 is nothing more than one of many device layers that make up the overall architecture of system 10. This layer, which includes MEMS RF components and potentially other components, is referred as the MEMS layer 26. Other circuit components layers 27, 28, and 38 are formed in the LTCC substrates 11 and 12.

The two multilayer LTCC substrates 11 and 12 forming module 10 are formed and fired separately using the standard LTCC fabrication process shown in FIG. 5. LTCC technology is inherently cost-effective compared to any fabrication technology with traditional photolithographic processing. The patterning of layers at step 110 is performed in a single step, as opposed to 8–10 steps in traditional photolithography. Secondly, via holes can be opened at step 112 and filled at step 114 with conductor inks effortlessly. This allows construction of multiple layers at step 116, forming an integrated system 10 in one package, as shown in FIG. 1. The process of FIG. 5 eliminates all of the packaging issues regarding the MEMS RF devices and associated passive layers, such as resistors, capacitors, electrical vias, and electrical interconnects. Although current LTCC fabrication lines handle 15×15 cm plates, the fabrication capability for 45×45 cm plates has been demonstrated and can be further extended up to 100×100 cm. Therefore, it is possible to obtain large numbers of MEMS RF devices from a single LTCC plate. The LTCC technology allows the integration and packaging of all the device layers necessary for the system 10, except one layer, i.e., the MEMS layer 26.

The MEMS RF devices 14 are fabricated directly on layer 29 of LTCC substrate 11. Minimum features (as small as 1 μm) required for MEMS RF devices or systems 14 are considerably smaller than what can be achieved (>100 μm) by using screen-printing techniques. Therefore, the surface of buffer layer 29 must be prepared for photolithography steps. The minimum feature achievable using lithographic patterning on LTCC with an unprepared surface is about 20 μm. To overcome this limitation, the present invention uses special surface preparation techniques, such as chemical-mechanical polishing, combined with thin-film deposition technology, photolithography and etching technologies to obtain the required resolution for MEMS RF devices and systems 14 on LTCC layer 29. These MEMS RF devices 14 are then packaged when LTCC substrates 11 and 12 are bonded together, and cavity 13 in module 12 is placed on top of the MEMS RF devices or systems 14.

Both LTCC substrates 11 and 12 include numerous vertical connections 16, and 39 and screen-printed conducting layers 17 and 23 between the dielectric layers 22 comprising each system 10. The vertical connections 16 and 39 are preferably metal-filled via connections. To minimize coupling between different device layers in high frequency applications, stripline topology is preferred for the electrical devices 28 fabricated in the internal layers of LTCC substrate 11.

For some applications, particularly high frequency applications, it is well known that different devices have different characteristic impedance requirements. Termination resistors and other impedance matching components can be fabricated either in the internal layers of substrate 11, such as "buried in" resistors 24 shown in FIG. 2, in which case they will vary ±20% around a mean value. The termination resistors can also be located on a surface 25 of the LTCC substrate 11 where they can be trimmed to higher accuracy such as ±1%.

The screen-printed or photo patterned layers 17, and 23 are buried metal patterns which are used to define interconnections and passive electronic or microwave devices, such as resistors, capacitors, inductors, transmission lines, couplers, dividers, etc. The resistance of resistors on the surface 25 of LTCC substrate 11 or through the layers of LTCC material forming substrate 11 can be controlled by the dimensions of these metal lines. Similarly, the values of other passive components can be adjusted by suitably varying the dimensions of these components. For example, the characteristic impedance of the transmission lines is preferably controlled to be in the range of 30 ohms to 100 ohms. This can be done by controlling the thickness of the ceramic dielectric layers 22 and the width of the signal conductor following well known formulas available in the literature for a variety of transmission line configurations.

Preferably, the material system used for dielectric layers 22 is 943 Green Tape™, a product made by Dupont. The use of 951 Green Tape™, another product made by Dupont, for dielectric layers 22 allows the unacceptable losses of LTCC materials at higher frequencies (20 GHz and above) to be avoided. DuPont's 943 Green Tape is a gold, silver and mixed metal compatible low-loss, low CTE, lead free glass/ceramic tape, which allows transmission line losses as low as 0.2 dB/cm at 30 GHz to be achieved. However, presently, Dupont 943 has only one thickness of dielectric tape. The dielectric constant ($\epsilon_r$) and the loss tangents of Dupont 943 dielectric sheets are 7.5±0.1 and 0.001, respectively. (Reference 99% alumina, a well-known microwave substrate, has a dielectric constant of 9.6 and a loss tangent of 0.001). Using the Dupont 943 material system to form LTCC modules 11 and 12 allows low characteristic impedance values (<40 ohms) to be obtained, if the signal plane 23 is separated from top and bottom ground planes 17 (for symmetric stripline configuration) with a single dielectric material as is important for high frequency applications. Device layer 28 shown in FIG. 2 illustrates cross-sectional views of symmetric stripline configurations. The stripline in layer 28 consists of three conductive planes: two of them ground planes 17 and a signal plane 23 in the middle. Vertical connections 39 connects signal plane 23 from one device to another one by going through the ground planes 17. Based on the limitations on minimum patternable conductor width, high impedance values (>60 ohms) may require more than one LTCC layer on both sides of signal plane 23. If the minimum line width is around ~100 μm (as in the case of most screen-printing based patterning techniques), then to achieve 50 ohm lines in a Dupont 943 LTCC system ($\epsilon_r$=7.5 and fired thickness ~110 μm) two dielectric layers 22 have to be used on both sides of signal plane 23.

As shown in FIG. 2, in the preferred embodiment of the invention, the RF device layer 28 in LTCC substrate is formed using two layers of 943 dielectric tape 22. Of course, the number of layers needed would change if a different dielectric with different properties and thicknesses were used.

A stripline transmission line configuration is preferable because ground planes 17 on both sides of the stripline circuits help minimize the interference between circuits in the different layers 28, 26 and 38. Therefore, the electromagnetic isolation between the vertical circuits is easier to achieve. In addition, the stripline configuration has a homogeneous dielectric medium, which lowers signal dispersion.

Other transmission line configurations, such as shielded-coplanar transmission lines, can be used in the internal device layers such as 28. At outer surfaces, variations of microstrip and coplanar configurations can be used. For the MEMS RF device layer 26, a conductor-backed coplanar configuration is preferable.

All the vertical connections 16 and 39 shown in FIG. 2 are the same. However, functionally, there are important differences. Vertical connections between the ground planes are not that critical for signal integrity. On the other hand, connections between the signal planes are understandably more important. Vertical connections 16 are ground connections for device layer 28, whereas vertical connections 39 are signal connections for device layer 28 in FIG. 2. The shielding for vertical connections is important if they originate from a signal plane. Thus, the vertical connections between two layers of devices 39 can be unshielded or shielded coaxial-type connections. In both cases, vertical connections 39 have to be designed carefully to minimize the internal reflections and losses between two layers of devices 28, 26, and/or 38.

Vertical connections 16 can be also used to shield electromagnetic interference and coupling. If there are multiple components in a single layer, grounded-vertical connections 16 placed between them will lower interference significantly.

FIG. 2 also shows an Integrated Circuit (IC) substrate 19 being mated to LTCC substrate 12 so as to provide active microelectronic functionality. FIG. 2 also shows an Integrated Circuit (IC) substrate 20 mated to the LTCC substrate 11 so as to provide active microwave functionality.

To make proper electrical connection, ICs 19, and 20 can be flip-chip bonded to LTCC substrates 11 and 12 respectively. Copper thermal spreaders 21 can then be mounted directly on the backside of ICs 20, if necessary. If IC power consumption is not an issue, then low-cost wire-bonding techniques can also be employed to mount low pin-count ICs 19 on LTCC substrate 12 (note that wire-bonding option is not shown in the figure). Integrated circuits 19, and 20 can be any of the following: a control circuit for the MEMS RF components, a power module for such MEMS RF components, a microprocessor or a signal processor, a power amplifier, a low noise amplifier, or any other analog/digital integrated circuits that are necessary for the operation of the RF system.

As illustrated in FIG. 2, lower LTCC substrate 11 has three distinct functional areas, i.e., an interconnection layer 38, one or more device layers 28, and a buffer layer 29. The interconnection layer 38 is used to interconnect through connections 18 and 39 different ICs 20 and lumped components such as inductors, capacitors, and resistors 25, either discrete or formed in or on the LTCC substrate 11. The device layer 28 is distributed or lumped, as necessary, for proper operation depending on the frequency. If there is more than one device layers, they are connected together by a connection 39 extending between such layers. Several device layers can be integrated vertically in this section as needed for the application.

The buffer layer 29 is used only for connection, through a vertical connection 16 and 39, to the MEMS RF devices 14, which are formed on top of this layer. Since the front surface 71 (in FIG. 6) of layer 29 is polished prior to the fabrication of the MEMS RF devices 14 on top of layer 29, no surface conductors are printed prior to polishing. In the preferred process flow, LTCC compatible bonding materials are printed and fired after polishing. However, it is possible to have one un-patterned conductor layer, which is deposited as a part of the LTCC process. In this case, the surface preparation would include metal polishing rather than ceramic polishing, and the MEMS process sequence shown in FIG. 4 must be modified accordingly.

The second LTCC substrate 12, as shown in FIG. 2, also can have a multiplicity of functional layers, including a MEMS cover layer 37 and one or more device layers 27, depending on the exact design configuration. MEMS cover layer 27 includes a cavity 13 for MEMS devices and systems 14 that enables proper packaging of the MEMS devices and systems 10 fabricated on LTCC substrate 11. Device layer 27 is one or more layers of passive devices. One or more connections can be made to the shielding ground plane 17.

Surface preparation for buffer layer 29, which acts as a substrate for the fabrication of MEMS devices 14, can potentially include multiple steps such as planarization of ceramic parts, planarization of first metallization, and deposition of bonding materials. The last two items are optional because it is obvious to those skilled in the art of hermetic packaging and MEMS fabrication that there are many different ways to achieve the desired hermetically sealed cavity formed by the bonding of the two LTCC substrates 11 and 12.

Surface planarization is necessary prior to MEMS fabrication due to large surface roughness of fired ceramic parts. The surface roughness is determined both by the intrinsic roughness of dielectric sheets and buried features underneath the surface. Typically the contribution from the latter source is more important; however, even the intrinsic roughness ($R_a$) for fired Dupont 943 dielectric sheets is on the order of 1 µm. Accurate, high-yield, and reliable fabrication of MEMS RF devices necessitates $R_a<0.1$ µm. $R_a$ is the average surface roughness calculated as an average of several point measurements taken with a single scan. If the MEMS process starts with such smooth surfaces, MEMS RF devices with features as small as 1 µm or less can be fabricated. To accomplish this goal, the fired LTCC plates (or wafers) on which the MEMS processing is performed are lapped and polished.

Regular ceramic polishing has common problems, such as dishing and erosion. Dishing and erosion are forms of local planarization where certain areas of the wafer polish faster than others. In dishing, a softer material (e.g., metals) is "dished" out of the lines, where as in erosion whole sections of the ceramic are polished faster than others are. As shown in FIGS. 6a through 6d, these are not particularly important problems for the MEMS RF devices, as long as such devices are placed outside the dishing and erosion area 72, which, as shown in FIGS. 6a through 6d, is less 250 µm from the center of vertical connection 71. In certain design configurations of the present invention, it may be desirable to reduce or eliminate dishing. For example, this may be important for optimization of the use of the surface area of the ceramic substrate, i.e., more devices and components per square area of substrate. Dishing can be reduced or eliminated by optimization of the planarization slurry, adjustment of the polishing force, varying the polishing pad spin rate, use of an optimize polishing pad, etc., as well as the addition of another planarization for the first metallization used in the MEMS process. Alternatively, dishing can be reduced or eliminated by application of a suitably patterned protective layer on the surface of the exposed metalized areas prior to the planarization process. This allows the ceramic material to be exposed to the planarization process while the metal is protected. This protective layer is subsequently removed after the planarization is complete.

Another optional step, which can be done as a part of surface preparation, is the deposition of bonding materials on the surface of buffer layer 29 prior to MEMS processing. LTCC material systems usually include a low-temperature, two-component bonding/brazing materials such as Dupont 5062/5063. This particular brazing system is used in several applications that require hermetic sealing in demanding space applications. Other alternatives include using regular flip-chip bonding techniques and dielectric bonding, such as glass-frit bonding. If the MEMS RF devices can sustain elevated processing temperatures, these materials can be deposited after the MEMS process. If not, as in the case if Dupont 5062/5063, they must be prepared before the MEMS parts are fabricated. In the preferred embodiment of the invention, a Dupont 5062 adhesion layer and a Dupont 5063 soldering conductor are deposited and fired at >800° C. following manufacturers suggestions. This process is illustrated in FIGS. 7a through 7d, and needs to be done on both bonding surfaces of the LTCC substrates 11 and 12. Bonding can be done using eutectic bonding, or bonding using insulating layers, such as glass-frit or thermalsetting polyimide films, etc.

According to the process shown in FIGS. 7a through 7d, the front side 73 of ceramic substrate 11 is planarized, whereby contacts 74 are exposed, which are vertical connections, such as 39 in buffer layer 29, protruding through. Thereafter, as shown in FIG. 7b, the Dupont 5062/5063 brazing system is screen-printed on external bond pads 74. In this step, a Dupont 5062 adhesion layer 75 and a Dupont 5063 soldering conductor 76 are deposited on the contact pad 74 and fired at >800° C. A seal ring 15 is also formed around MEMS RF device and system area 77.

A MEMS fabrication process (see FIGS. 8A–8F) is then carried out on the front side 73 of ceramic substrate 11 so that MEMS devices and systems 14 are formed in the MEMS device area 77. Similarly, on the back side 80 of ceramic substrate 12, shown in FIG. 7d, is also screened-printed with the Dupont 5062/5063 two-component brazing system in a manner similar to that used with ceramic substrate 11. In the case of ceramic substrate 12, a Dupont 5062 adhesion layer 82 and a Dupont 5063 soldering conductor 84 are deposited on contact pads 78, and a seal ring 88 is deposited around a cavity 13 which is designed to accommodate the MEMS RF devices 14 when the front side 73 of ceramic substrate 11 and the back side 80 of ceramic substrate 12 are bonded together. The bonding of these two modules is preferably done at a low-pressure in a low-humidity environment.

Once the surface preparation is completed, the MEMS fabrication process can start. Various MEMS process flows, which do not require high temperature, can be followed. One possible MEMS process flow for a RF switch is shown in FIGS. 8A–8F.

The process flow illustrated in FIGS. 8A–8F involves three metal depositions. The first metal is used to define the planar waveguide structures. In FIG. 8A, a preferred configuration 120 for coplanar waveguides with finite-ground-plane extension is shown. Configuration 120 is the three metal depositions 122 shown in such figure. The two outmost strips 124 are used for electrical connection to an air-bridge. This first metal 120 can be deposited on LTCC wafer 118 typically using a physical deposition method, such as evaporation, sputtering or electrochemical deposition, and then it is patterned one of two possible ways. If the desired film thickness is relatively thin compared to the thickness of the resist or masking layer, it can be patterned using a well-known fabrication technique called "lift-off".

Typically, to lower the propagation losses at high frequencies (>1 GHz), metals with low resistivity values, e.g., gold, silver and copper, are preferred. In addition, thick metals (t>1 um) are more favorable to lower the resistive (ohmic) losses. As thickness of metal film 120, increases relative to the thickness of the resist or masking layer, it gets more difficult to use lift-off patterning. Instead, patterning using a "mask and etch" process becomes more favorable. In the sequence, first metal 120 is etched using a photoresist mask, which is patterned using a standard photolithography step. As is known by those skilled in the art of integrated circuit fabrication, it is possible to have even thicker metal patterns using photoresist molding and electro or electroless deposition methods. Generally, such methods may also require additional planarization step to eliminate local thickness variations. In addition, it may be desirable to add an adhesion layer to improve the adhesion between the desired metal film and the substrate. The resulting pattern is shown in FIG. 8A.

Next, a sacrificial layer 126 is deposited to form the air gap necessary for the operation of the switch. Many types of sacrificial layers can be employed at this step. The key is selectivity of release etch. The sacrificial layer 126 must be chosen such that the metal does not get etched during the release etch. As described in U.S. Pat. No. 5,578,976, certain polyamides layers can be used as a sacrificial layer since these films can be easily removed in O2 plasma without significant effect on exposed gold metal conductors. Another important factor for selection of a suitable sacrificial layer is the deposition temperature of the sacrificial material 128. It must be low enough so that it can be deposited after the first metal layer 120 is already on the substrate. In the preferred method, PlasmaEnhanced Chemical Vapor Deposited (PECVD) silicon dioxide can be used as a sacrificial layer material since this material can be deposited at sufficiently low temperatures that the metal layers are not affected. These PECVD silicon dioxide films can be subsequently removed in an buffered oxide etch or diluted hydrofluoric acid solution without degradation of the gold metallization as shown in FIGS. 8A to 8F. If the thickness of waveguide layer 120 is more than 3 µm, it is preferable to use a planarization such as chemical-mechanical polishing step after silicon dioxide deposition.

The thickness of sacrificial layer 126 may vary depending on the switch requirements. Typically, it is between 2–4 µm thick. The most important consideration is the OFF-state capacitance of the switch. The value of the OFF-state capacitance decreases as the height of the bridge (the thickness of the sacrificial layer) increases. FIG. 8B shows the sacrificial layer after anchor patterning.

The rest of the process steps shown in FIGS. 8C to 8F relate to formation of an air-bridge, which is well know in the art. First, the contact metal 128 is formed using lift-off or direct patterning on top of sacrificial layer 126 using physical deposition as illustrated in FIG. 8C. Next, a structural layer 130, for example plasma enhanced chemical vapor deposited silicon nitride layer, is put down and patterned (FIG. 8D). Then, the third metal 132 is formed again using lift-off or direct patterning as shown in FIG. 8E. Finally, the sacrificial layer 126 is selectively etched releasing the air-bridge 134, as shown in FIG. 8F, in this case using buffered oxide etch or diluted hydrofluoric acid solution. To improve the etch performance it is customary to add etch holes if the areas to be released are wider than 100 µm. Finally, to minimize the effect of stiction, a supercritical point CO2 dryer may be used.

Air-bridge 134 can be formed by other fabrication methods as well. Although low-loss requirements may favor thick plated bridges, mechanically such bridges are not very robust; therefore, thinner but higher quality films may be preferable instead. But if quality is more important, it is possible to increase the thickness of the second metal layer 130 using electro or electroless deposition techniques.

The fabricated air-bridge 134 can be used as an electro-statically activated MEMS RF switch simply by applying a voltage between ground planes and the air-bridge 134. With the applied voltage, bridge 134 is pulled down, resulting in very high capacitance between the ground plane and signal line, thus essentially shorting the signal line to ground at frequencies above 1 GHz. When the potential between the plates is removed, air-bridge 134 will restore itself to its original form due to the mechanical restoring force of the upper electrode of the switch device. Several MEMS sequences described in the following patents and publications could be used instead. U.S. Pat. No. 6,069,540, issued June 1999; D. Hyman, et al. *Electronics Lett.*, vol. 35, no. 3, pp. 224–226, February 1999; S. Pacheco, et al. *Proc. IEEE MTT-S Int. Microwave Symp.*, pp. 1569–1572, June 1998; S.-C. Shen, et al. *Dig. IEEE IEDM Int. Electron Devices Meet.*, December 1999. Additionally, other actuation methods may be used including piezoelectric, thermal bimetallic, shape-memory allow, etc.

To prevent stiction between contact surfaces of MEMS RF switch, and to maintain low-resistance contacts in switches, surface treatments may be necessary to avoid contamination and unwanted chemical reactions, such as oxidation. Commercially available anti-stiction coatings, such as the dichlorodimethylsilane (DDMS) monolayer, the octadecyltrichlorosilane (OTS) self-assembled monolayer, or similar products can be used on the metal surfaces to minimize any unintentional adhesion in mechanical switches or other contacting or near-contacting surfaces within the present invention.

The MEMS processing can be performed on large-area-processing (LAP) equipment (not shown). This equipment, like LTCC processing tools, can handle very large panels (or wafers). The current generation of the LAP tools has the capability of processing panels larger than 800×800 mm and capable of handling minimum features as small as 2 μm or less. On the other hand, current generation of LTCC manufacturing tools can process only 200×200 mm panels, though it is straightforward for sizes to 800×800 mm and beyond.

The MEMS fabrication is followed by the bonding of the two LTCC substrate 11 and 12 at low pressure and in a low-humidity environment. If other bonding techniques were used, the necessary surface preparation would precede the selected bonding process. The bonding of ceramic substrates 11 and 12 can then be followed by the integration of ICs 19 and 20 and other discrete components (not shown) on the backside of ceramic substrate 11 (see FIG. 2). For this purpose, flip-chip bonding is more reliable and repeatable, and lends itself to better thermal management options, as described below. Therefore, especially high-power, high-frequency ICs 20 are preferably flip-chip bonded in shielded cavities in ceramic substrate 11 to minimize the electromagnetic coupling to other sensitive circuits and to achieve better heat removal from the backside of ICs 21. ICs 19 and 20 can be analog or digital ICs, MMICs and/or Radio Frequency Integrated Circuits ("RFICs"). There is no clear distinction between these two terms, though typically RFIC is used for chips with operating frequencies <10 GHz.

The quality of flip-chip bonds are assessed by determining the detuning of the circuits due to their proximity to ceramic substrate 11, the reflection due to transition, and the insertion loss at each connection. Typically, the size of the pads 18 (in FIG. 2) and the metal extensions are preferably selected to be as small as possible to minimize parasitic capacitances. The height of the pads 18 is typically chosen to be larger than one third of ground-to-ground spacing on the 50 Ω CPW lines on chip to minimize the detuning. By careful placement of contact pads 18, and if necessary, inductive compensation, a return loss above 25 dB at 40 GHz and an insertion loss of less than 0.25 dB can be achieved.

Dupont 943 dielectric tape has thermal conductivity of ~5 W/mK. This conductivity can be further improved by using conductor-filled thermal vias 16 and 39. It has been shown that with proper thermal design, it is possible to obtain thermal conductivities close to those of costly Beryllium Oxide ("BeO") and Aluminum Nitride ("AlN") (>250 W/mK) substrates. Here, thermal spreaders 21 are mounted on the backside of the flip-chip bonded ICs 20. If the device is placed in a shielded cavity which is the same as the thickness of ICs 20, the thermal spreader 21 will function as an electromagnetic shield too.

The fabricated air-bridge 134 (in FIG. 8F) can also be used as an electrostatically activated MEMS variable capacitor simply by applying a voltage between ground planes and the air-bridge 134. With the applied voltage, the bridge 134 deflects under the electrostatic force and thereby changes the separation between the two capacitor electrodes resulting in a changing capacitance of the device. The MEMS-based variable capacitor can be operated without reaching the pull-in voltage or can be operated beyond the pull-in voltage, depending on the exact design configuration.

Figure 9A:
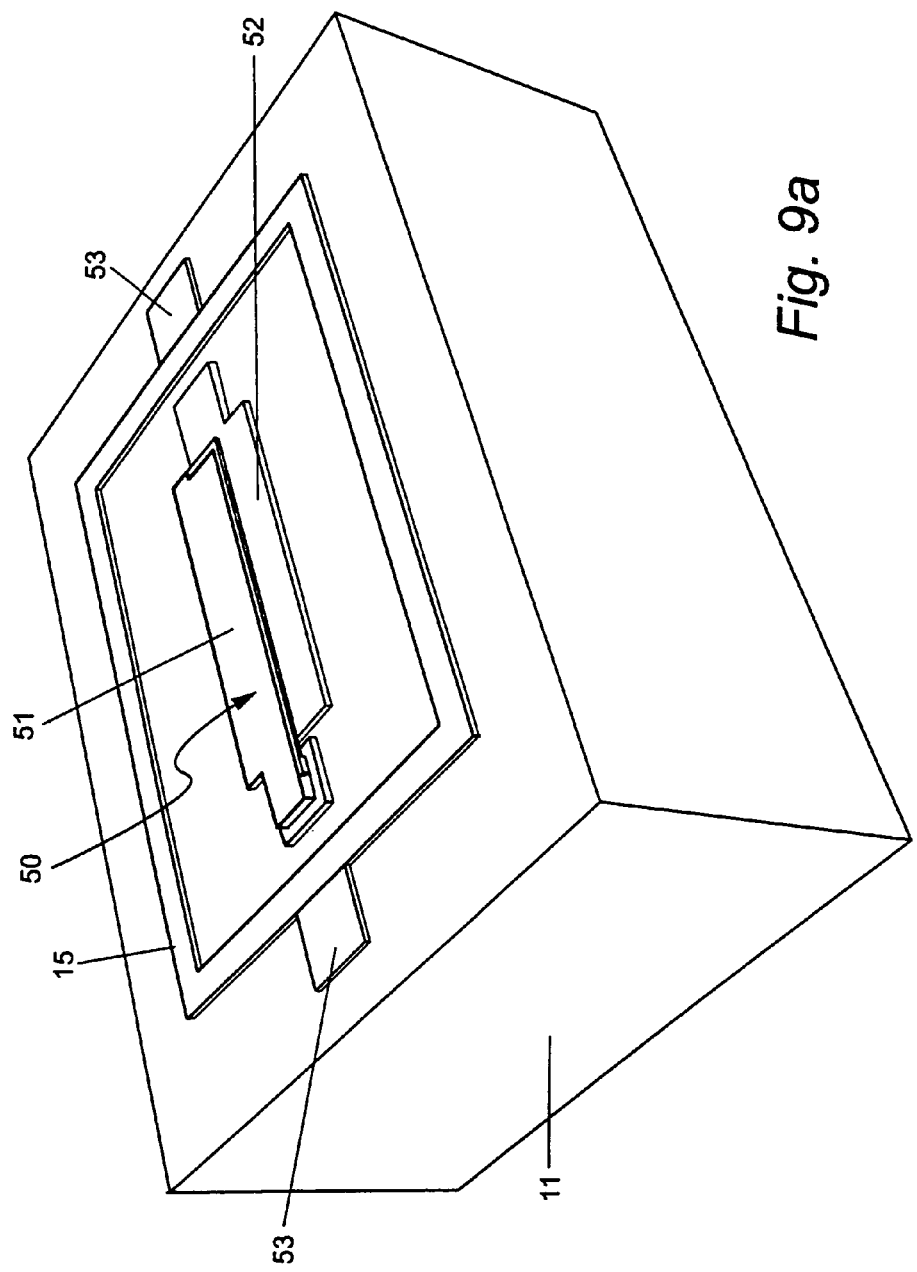
FIG. 9A is a perspective view of the preferred embodiment of a MEMS tunable variable capacitor device or system fabricated on and packaged within a stack of multiple layers of LTCC material.
Figure 9B:
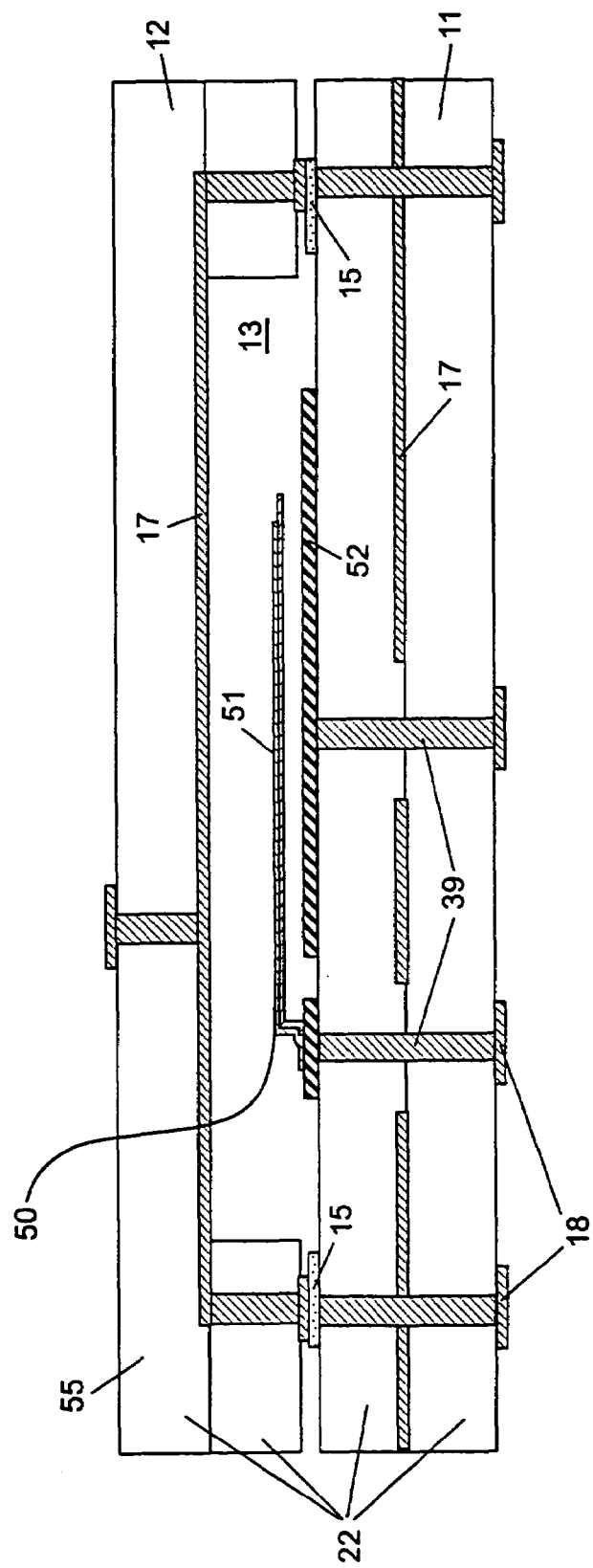
FIG. 9B is a cross-sectional view of the single tunable capacitor packaged in an LTCC module.

The MEMS-based electronically-tunable variable capacitor is shown in three-dimensional perspective in FIG. 9A in cross section in FIG. 9B. As shown, the device merges an electrostatically actuated micromechanical variable capacitor device 50 on a multi-layered substrate material 11 having continuous electrical connections 39 through the layers of substrate 11. The same substrate material 22 is used to enclose the device by selectively removing a portion of the upper substrate 12 so as to form a cavity 13. The two substrates 11 and 12 are then bonded together to enclose and protect the variable capacitor 50.

The package containing the variable capacitor device 50 is able to be surface mounted onto a ceramic or PCB as shown in FIG. 9B. Electrical connections 39 to device 50 are made to the external connections 18 on substrate 11 using solder and similar techniques.

Electrostatic actuation is the preferred method of embodying an electronically controllable moving electrode for a variable capacitor device 50. Electrostatic actuation is an extremely popular technology for the implementation of movable devices that require small to moderate displacements in combination with high operating frequencies. Additionally, electrostatic actuation is the preferred method of actuation for MEMS devices made using surface micromachining techniques, such as in the present device 50.

There are two undesirable issues related to the use of electrostatic actuation that must be addressed during the design of a wide dynamic range variable capacitor device. The first issue with electrostatic actuators is the potential instability (sometimes termed "collapse voltage" or "pull-in voltage") of the compliant electrode 51 toward the fixed electrode 52 as the gap between the electrodes is decreased with increased actuation voltage. This occurs since the electrostatic force is inversely proportional to the square of the electrode separation, whereas the counteracting mechanical restoring force is typically only linear with displacement (assuming a perfect spring for the mechanical restoring force). It can be shown that collapse occurs in such a system when the displacement becomes approximately ⅓ of the initial un-deflected electrode separation. Therefore, if collapse is to be avoided in the device, the initial gap in the structure must be designed to be at least 3 times the maximum required displacement of the upper electrode. Associated with this effect, is the fact that the applied actuation voltages will need to be fairly high in order to move the upper electrode. This is because the initial gap spacing between the drive and upper electrode 51 will need to be large, namely three times the useful movable range of upper electrode 51 and the electrostatically generated force is proportional to the inverse of the gap separation squared.

As a result of this effect, most of the electrostatic actuated variable capacitors reported in the past have had a limited tuning range. Typically, the ranges of tuning that have been reported are no more than 25%. Theoretically, the maximum tuning range is slightly higher, but far short of the tuning range needed for many applications.

Figure 9C:
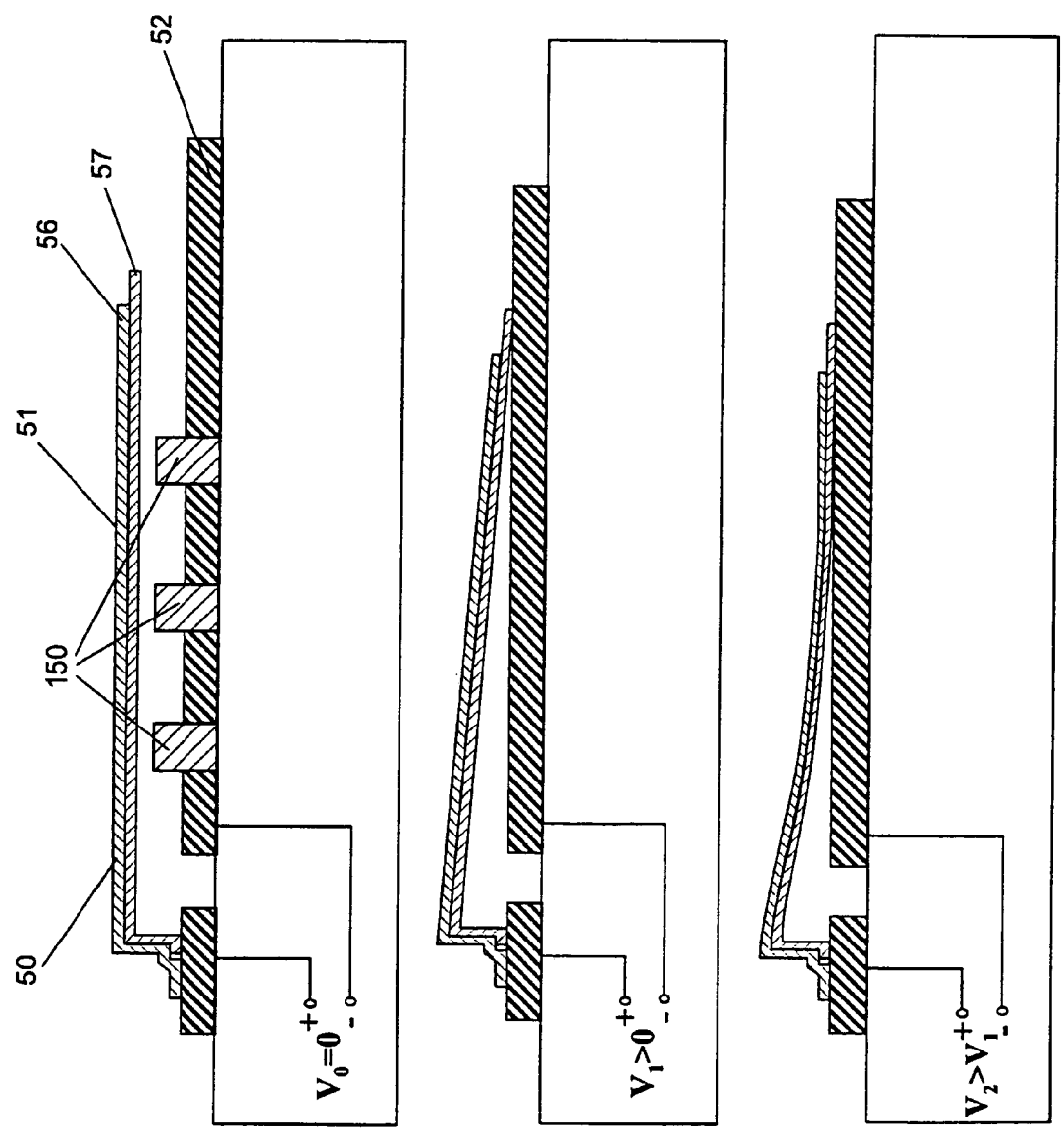
FIG. 9C illustrates the operation of the tunable capacitor of FIG. 9B according to the present invention.

An approach to overcome the tuning range limitation of electrostatically-actuated parallel plate configurations and an important part of the present invention is to utilize a zipper actuation method as shown in FIG. 9C. In this approach the upper electrode 51 intentionally comes into contact with the bottom electrode 52. As the actuation voltage is increased, an increased amount of area of the upper electrode 51 is brought into contact with the bottom electrode 52 (FIG. 9C). The applied DC voltage controls the shape of the upper electrode. The capacitance between the upper 51 and lower electrodes 52 changes with the applied DC voltage. Furthermore, the shape of the capacitance-voltage characteristic for the device is primarily determined by the geometry of the capacitor electrodes 51 and 52. In this approach, a dielectric layer 57, is required to prevent the electrically conducting 56 part of upper electrode 51 from contacting the conducting bottom electrode 52 (i.e., to prevent a short circuit between the electrodes). While not mentioned here, there are also other methods to provide for an increased moving distance of the electrode and thereby increased tuning range.

The second issue is that the electrostatic force is not proportional to the applied actuation voltage, but varies with voltage squared. In certain devices, such as clamped membranes or beams, it is possible to modify the counter electrode to somewhat linearize the relationship between actuation voltage and displacement in a certain operating range. For example, removing the counter electrode in the center area, it is possible to match the leveraging of the beam to the non-linear relationship between actuation voltage and electrostatic force, to achieve a close to linear relationship. For a suspended structure, the whole structure deflects uniformly and therefore the electrostatic force will also be uniform, and there is no non-uniformity to match to the non-linear actuation force. One way to linearize the response would be to create non-linear suspension springs for the structure, but this makes the design of the device difficult.

Even though the actuation force is a non-linear function of the applied voltage for the non-contacting electrode arrangement, this problem can be reduced or nearly eliminated with the zipper electrode configuration, as shown in FIG. 9C. In this configuration, the capacitance can be made to vary nearly linearly with the applied voltage using a specially designed electrode 51. The way this is done is to have the area of the nearly contacting surfaces, namely after collapse of the electrode into the mechanical stops 150, compensate for the non-linear electrostatic versus voltage effect. Since the fabrications of mechanical stops 150 adds several additional steps to the overall MEMS process sequence in FIGS. 8A–8F, generally, the mechanical stops are not used in variable capacitors unless they are required to achieve a certain performance specification, such as voltage-capacitance linearity.

Although electrostatic actuation for non-collapsing structures typically require high voltages due to the inherently small electrostatic forces generated, this problem is lessened using zipper actuation. In this method, the initial electrode gap can be made quite small while still achieving a relatively large tuning range. Tuning ratios in excess of 10 to 1 with applied voltages not in excess of 50 Volts for the zipper actuator configuration are possible.

Although an electrostatic actuation mechanism using the zipper actuator approach is described, there are alternative methods of electrostatic actuation that can be used in the present invention. For example, another embodiment of the electrostatic actuated variable capacitor would be to use a non-contacting actuator. This embodiment requires the distance between the electrodes to be sufficient enough to avoid collapse, as described above. Another approach is to use a non-linear spring whereby the non-linearity of the electrostatic force is compensated by the non-linearity of the mechanical restoring force mechanism. Other approaches are also possible. The MEMS variable capacitor can also be actuated using other means, such as bimetallic effect, shape memory alloy, piezoelectrics, etc.

A substantial advantage of a electrostatically actuated variable capacitor device of the present invention is that it can be made with a relatively simple and low-cost surface micromachining process as described herein.

Another design issue of an electrostatically-actuated variable capacitor is whether the device will be a one- or two-port device. The advantage of the one port, two terminal approach is that it is very simple; however, the disadvantage is that the actuation voltage and the voltage on the capacitor are coupled. A different approach and a feature of the preferred embodiment of the present invention is a two port, four terminal design wherein separate electrodes are used to realize the variable capacitor and the electrostatic actuator 51.

The LTCC material used for the substrate and package of the variable capacitor has very low resistive losses at high frequencies, which is important in satisfying the requirements for this device. The substrate material technology of the present invention is inherently very cost-effective compared to alternative approaches, such as fabricating MEMS on silicon or MEMS on GaAs, while also allowing high fidelity photolithography to be used to make high-precision and high performance micromachined elements. The substrate material is composed of a stack of layers 22 wherein each layer is uniquely patterned with openings that are filled with low shrinkage conductive inks to provide electrical connections through the layers 39. Metal lines or other features are patterned using photolithography on the surfaces of the layers with a minimum resolution of approximately 20 microns. This resolution increases to 100 microns if the lower cost alternative method of screen printing is used. The metal materials, which are deposited and patterned on the substrate layers, are excellent conductors and include gold, silver and copper. These are the preferred conductor materials to use for microwave applications. The individual layers are stacked together and bonded to form a composite substrate in which electrical feed-throughs span through multiple layers 22. Also, the metal conductor lines on the surfaces of the substrates 17 are enclosed with the stacked layers 22. Passive components such as resistors and capacitors 25 (FIG. 2) or ground planes 17 can be realized on the substrate surfaces 11 and sealed in the multi-layered substrate stack 24 (FIG. 2) depending on the exact design configuration. Additionally, cavities 13 can be carved out of the multi-layered substrates 11 that can be used to package a micromechanical element, such as a variable capacitor 50 or an integrated circuit 19 or 20, as shown in FIG. 2.

An advantage of the preferred embodiment of the present invention of the variable capacitor is that it enables the signal paths to be properly shielded, as shown in FIG. 9B. Shielding is achieved on the surfaces by appropriately laying out coaxial lines wherein the capacitor contacts 56 and 52 have ground lines 17 on either side. The vertical connections of the signal lines 39 can also be enclosed in a vertical ground shields (not shown) to minimize interference between vertical signal paths 39. This greatly improves the performance of the device at the higher operational frequencies. While these kind of connections (not shown) are very useful for microwave components, they are in practice very difficult and expensive to realize using conventional processing techniques on semiconductor materials. This feature combined with the low losses of the substrates and excellent conductivity of the capacitor materials, will enable high quality factors (Q's) to be realized which is an important high performance feature of the present invention.

The MEMS variable capacitor devices 50 are fabricated directly on the surface of a multi-layer stack of the substrate material 11. As mentioned previously, a surface preparation is performed prior to fabrication of the MEMS elements. Subsequent to this surface preparation, minimum features of 1 to 2 microns can be resolved. This surface preparation process and subsequent fabrication of micromechanical devices does significantly increase the overall cost of the fabrication, and the overall fabrication process will be relatively inexpensive compared to a processing sequence for semiconductor materials.

The packaging of the variable capacitor 50 is accomplished by bonding two pieces of the substrate material 11 and 12 together wherein one of the pieces has the variable capacitor device 50 on the surface and the other has a cavity 13 as shown in FIG. 9B and as described above. The bonding of substrates 11 abd 12 is performed using eutectic bonding, glass-frit or thermosetting polymers. A hermetic seal can be readily achieved in this bonding process and the micromechanical device can be enclosed in a low-pressure, low humidity environment. A treatment of the surfaces of the micromechanical device so as to avoid contamination, as well as reduce likelihood of chemical corrosion can be performed depending on the design. These surface treatments also help to reduce unwanted stiction effects between the contacting surfaces. Surface treatments are commercially available and have been discussed above.

The innovative approach of the present invention for the embodiment of a MEMS-based variable capacitor 50 has many advantages and addresses the two major challenges in the implementation of a MEMS variable capacitor device, namely cost and performance. The present invention uses a new substrate material that results in a dramatic lowering of cost for materials, as well as processing. By merging this material technology with MEMS, a major performance improvement over competing technologies is achieved, thereby enabling a high quality factor Q, a high self resonant frequency, and if used with a zipper electrostatic actuator, a large tuning ratio.

Figure 9D:
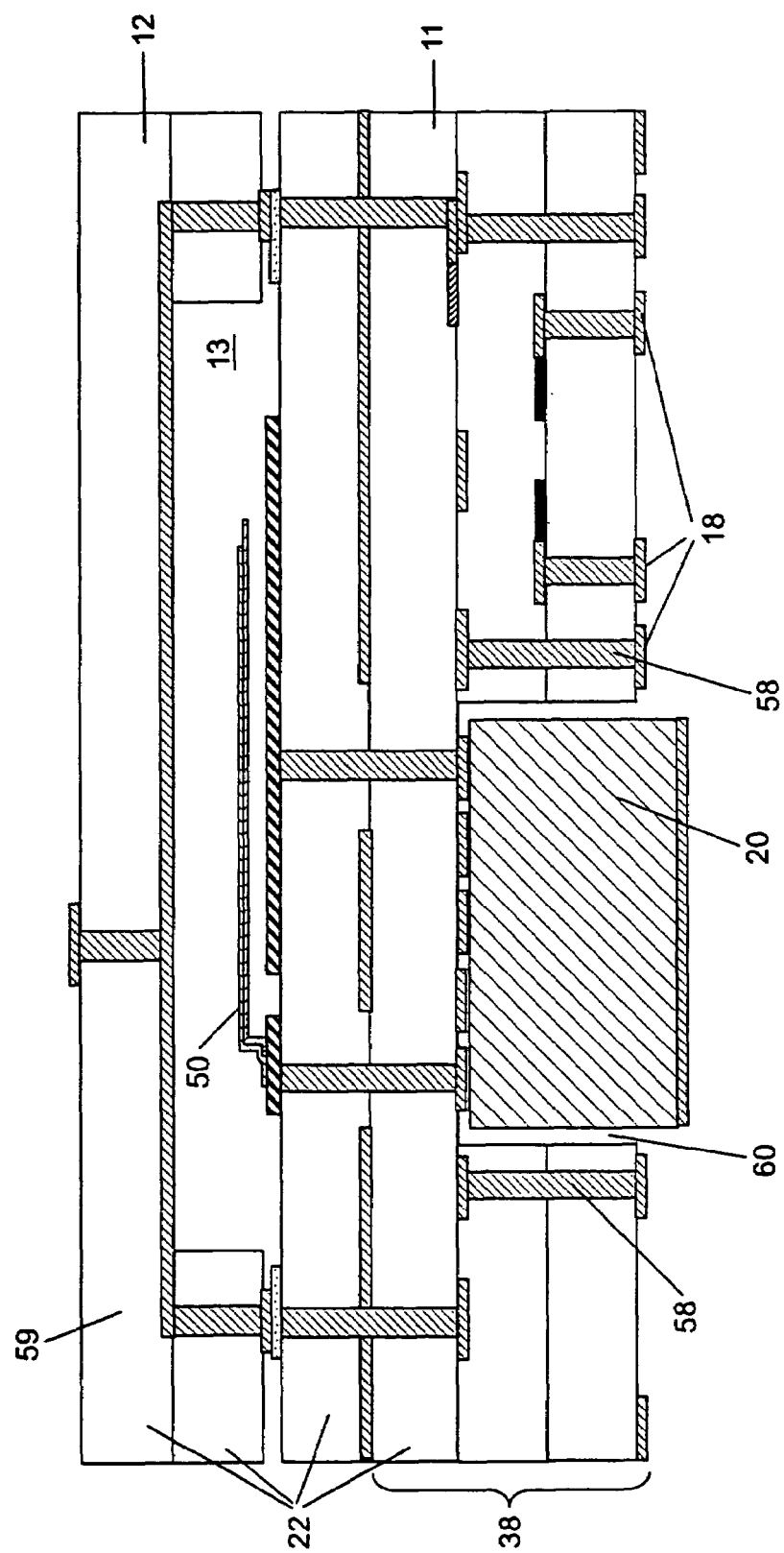
FIG. 9D is a cross-sectional view of the preferred embodiment of a MEMS closed-loop controlled tunable variable capacitor device or system fabricated on and packaged within a stack of multiple layers of LTCC material combined with an Integrated Circuit (IC) die.

Another such application of MEMS on LTCC is a MEMS-based closed-loop controlled variable capacitor 59 as shown in FIG. 9d. The embodiment of this device is similar to the discrete variable capacitor discussed above with the major difference being that the module 11 contains an integrated circuit 20, more layers of substrate material 22, and more electrical connections 58. The integrated circuit 20 is an important part of the closed-loop controlled variable capacitor device 59. As discussed above, integrated circuits or ICs can be integrated into the substrate material with relative ease with this technology. The integrated circuit 20 has the ability to accurately measure the actual capacitance of the variable capacitor 59 over the entire dynamic range, as well as control the level of voltage applied to the electrodes 51 driving the actuator 52 so as to achieve closed-loop control of the desired capacitance value. The relatively high voltages needed to drive the actuator may be generated on-chip or off-chip, depending on the cost and voltage levels of commercially available IC processes. In the preferred embodiment, flip-chip bonding of the integrated circuit 20 to the substrate 11 is used as shown in FIG. 9d above. As shown in FIG. 9d, a cavity 60 can be incorporated to encapsulate the IC die 20 and protect it from environmental effects.

Although the fabrication of the MEMS-based closed-loop controlled variable capacitor 58 is similar to the MEMS-based variable capacitor 55 (in FIG. 9b), there is additional complexity due to the need to provide for additional layers of substrate material 22 in order to make electrical connections 39 to the integrated circuit die 20 and the variable capacitor device 50, as well as connections from the IC die 20 to the outside of the module 18.

The present invention for the embodiment of a MEMS-based closed-loop controlled variable capacitor has many advantages and enables a MEMS variable capacitor device to be integrated with an IC at a low cost while proving excellent performance. Furthermore, the use of LTCC material in the manner described in the present invention enables the MEMS and IC devices to be packaged in a high performance enclosure at a low cost.

Figure 10A:
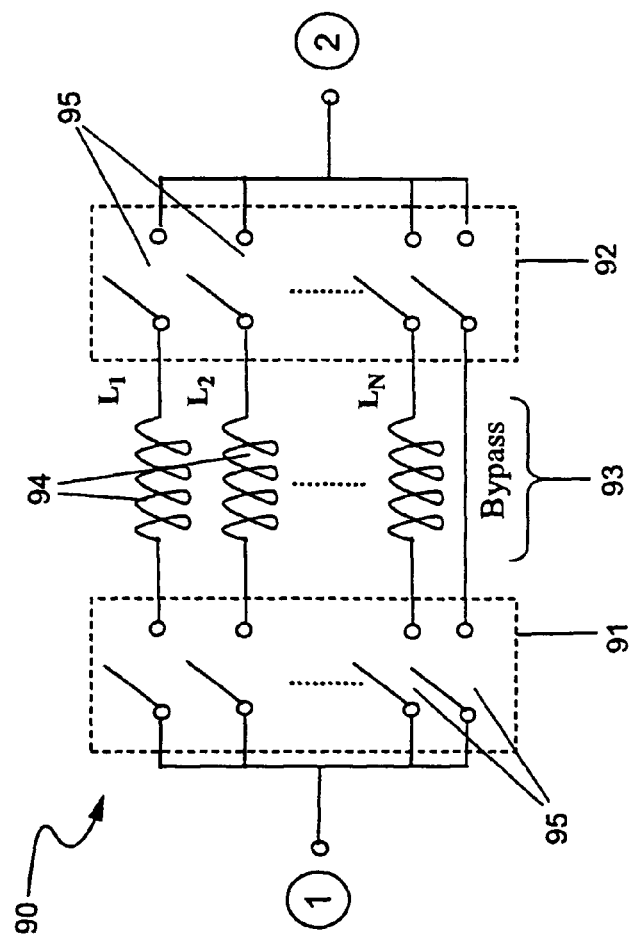
FIG. 10A is a schematic view of the tunable (switched) inductor.

Another embodiment of the present invention is a tunable or switched inductor 90, as shown in the FIGS. 10A and 10B. Induction 90 is made by combining MEMS RF switches 91 and 92 fabricated on the surface of a LTCC substrate 31 (See FIG. 3) as described above, with a network of passive inductors 93 also made on the surface of: LTCC substrate 31. The RF switched networks 91 and 92 placed on the ends of the inductor network 93 act to select the desired inductor(s) 94 from the network of inductors 93. In one embodiment, the inductor values are varied in increments of 0.5 nH from 1 nH to 10 nH. However, as can be appreciated by those skilled in the art, any number of variations of the inductor values can be made with this invention. The selection of the desired inductor is made by application of an external electrical signal to the variable inductor module or package 90. This signal is propagated through the connections made possible through the LTCC multilayered substrate to the RF switch, whereby the device switches to the desired inductor within the network. The level of voltage or current determines the switch setting and the resultant inductor selected. Alternatively, an IC die 36 is packaged in the module 90 (FIG. 10b) that receives a signal and determines which switch settings are made to select the desired inductor 94.

Packaging is achieved for this system in the manner described above whereby the passive inductor network 93 is sealed within layers of the device 28, as shown in FIG. 10B. LTCC module 31 and the MEMS RF switches 95 are enclosed within a cavity 33 formed in an upper LTCC module 32. Substrates 31 and 32 are bonded or affixed, as described above.

Fabrication of the MEMS RF switches is performed on the surface of a multiplayer stack of LTCC substrates as described in FIGS. 8A–8F. In order to fabricate high-fidelity, high-performance MEMS devices, it is necessary to prepare the LTCC surface in the manner described above. The second switch network 92 is optional. Network 92 can be eliminated by connecting the outputs of all inductors to the output. If this switched inductor system 90 is connected to ground at the output port, this is preferable to lower the losses in the system.

There are numerous well-known methods of realizing inductors 94 in the device layers 28 of LTCC module 31. The approximate inductance formulas for both planar and 3D inductor geometries is given in the design manuals for LTCC processes. More accurate formulas are also available in the literature. Despite its inherent 3D structure, due to relatively thick LTCC dielectric tapes (see 22 in FIG. 2), it is not feasible to realize true 3D coils using LTCC. Therefore rectangular, and octagonal shaped planar spiral inductors are more common. Using such planar geometries, inductance values between 1 to 100 nH can be achieved regularly. If higher values of inductance are desired, such planar inductors can be stacked. If stacked inductors are necessary, the ground shields 17 (FIG. 2) that would be used to isolate inductors should be avoided.

The advantage of the present tunable (or switched) inductor is that the performance of this device is very high compared to other technologies. This is due to the low dielectric losses of the LTCC material and the high performance of the inductors and MEMS switches. Furthermore, the cost of the device of the present invention is very favorable.

Figure 11A:
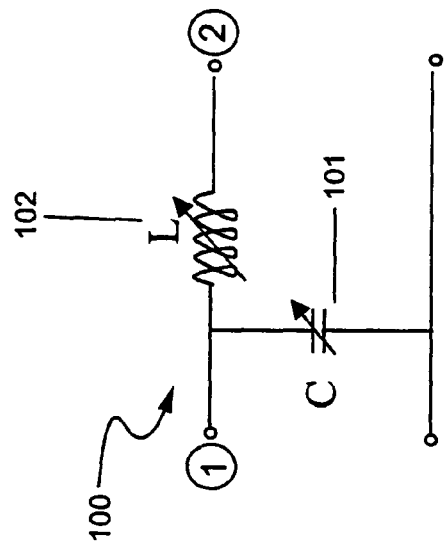
FIG. 11A is a schematic view of a generic tunable inductor-tunable capacitor network.
Figure 11B:
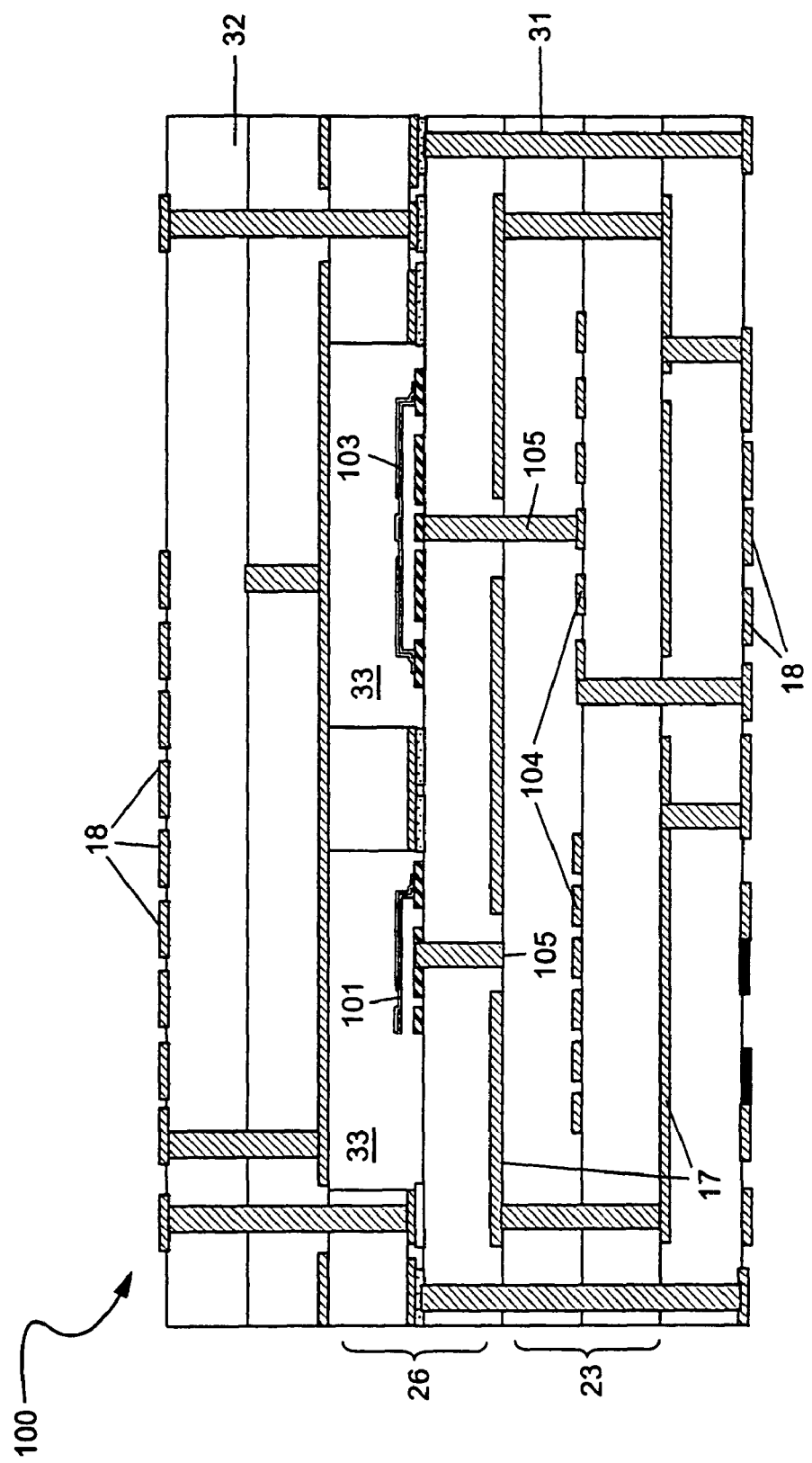
FIG. 11B is a cross-sectional view of the generic tunable inductor-tunable capacitor network.

Another embodiment of the present invention is a tunable inductor-capacitor (LC) network 100 as shown in the FIGS. 11A and 11B. This device is made by combining a MEMS tunable inductor 102 fabricated on the surface of an LTCC substrate 31, and as described above, with a MEMS variable capacitor 101, also as described above. Device 100 allows the tunability of both the capacitor 101 and inductor 102 values over wide dynamic ranges. Both the tunable capacitor 101 and the tunable inductor 102 are controlled using electrical signals 18 provided through the electrical connections made possible with the LTCC substrates 31 and 32. Fabrication for both the variable capacitor 101 and the tunable inductor 102, including the RF switches 103, are performed on a stack of LTCC layers to form a substrates 31, and as described above. Packaging is achieved for the MEMS devices, including the RF switches 103 and the variable capacitor 101 by bonding or affixing two LTCC substrates 31 and 32 as described above wherein one of the LTCC substrates 32 has a previously formed cavity formed 33 in the bottom surface. The MEMS devices 101 and 103 are fabricated on the other LTCC substrate 31 and the two substrates are joined together to enclose the MEMS devices 101 and 103 and provide protection to them while simultaneously providing electrical connections 105.

As can be appreciated by those skilled in the art, the MEMS-based tunable LC network 100 can be used as a tunable filter for a variety of communication applications. Integrated circuits, such as ICs 19 and 20 in FIG. 2, can be included in the LTCC MEMS-based tunable LC network module 100, as shown in FIG. 11B, so as to achieve closed-loop control of the tunable capacitor 101 and selecting the desired inductor 104, or other electrical functionality as desired.

Figure 12A:
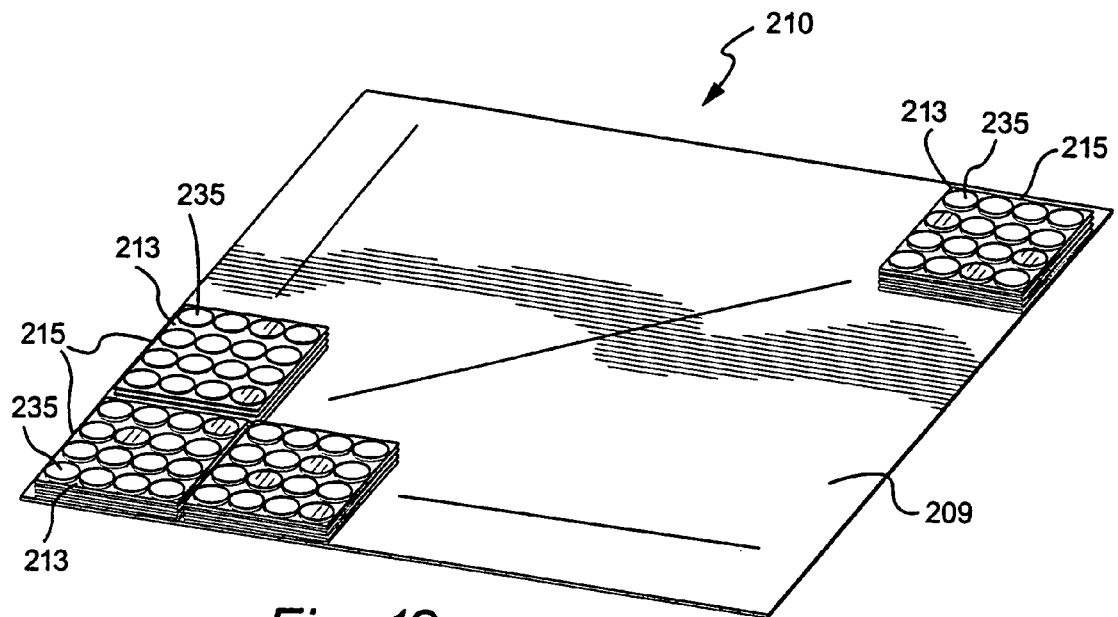
FIG. 12A is a partial perspective view of the preferred embodiment of integrated phased-array antenna system of the present invention showing some of the plurality of sub-array modules used to form the phased-array antenna.
Figure 12B:
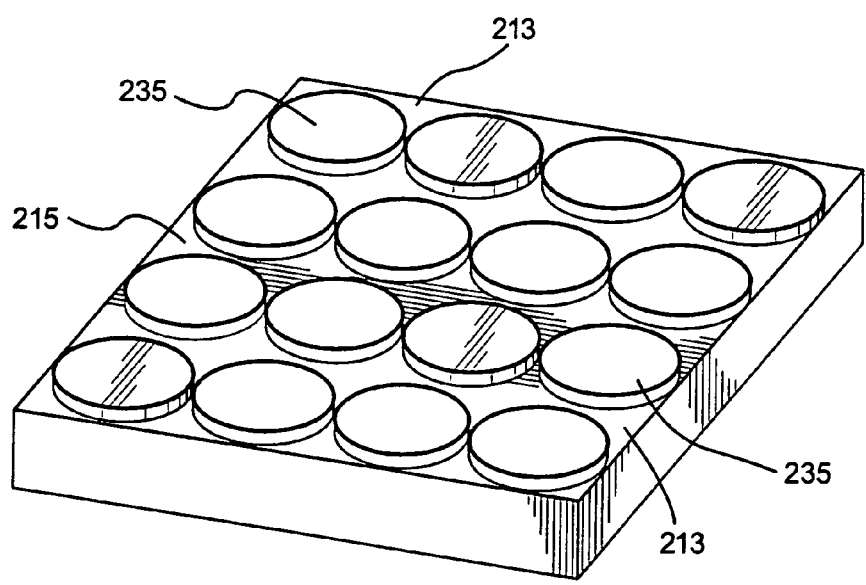
FIG. 12B is a perspective view of the preferred embodiment of the sub-array module which includes a 4×4 array of radiating elements.

Yet another application of the present invention is a Phased-Array Antenna as shown in FIG. 12a which illustrates partial components of a complete phased-array antenna system 210 that contains many sub-array antenna systems 215. A sub-array antenna 215 can, by itself, function as a phased-array antenna; however, it may not meet link requirements, such as gain to noise temperature (G/T) and equivalent isotropic radiated power (EIRP) unless an equivalent number of radiating elements are incorporated into the system.

Although the present invention is described herein with respect to a transmitting antenna, it can also be used with receiving antenna systems, as well. In addition, although the preferred embodiment of the invention is a single-beam system, those skilled in the art of antenna systems will appreciate that multi-beam antenna systems can be made using the fabrication principles of the present invention.

Referring to FIG. 2a, the sub-array antennas 215 comprising phased-array antenna system 210 are positioned on a sub-array integration medium 209. Each sub-array antenna 215, in turn, includes a plurality of radiating elements 213. The number of radiating elements 213 per sub-array 215 is mainly determined by the manufacturing yield of a sub-array. With a sufficiently advanced manufacturing capability it will be possible to fabricate phased-array 210 as a whole system, eliminating the need for integration of sub-arrays 215 using integration medium 209.

Figure 12C:
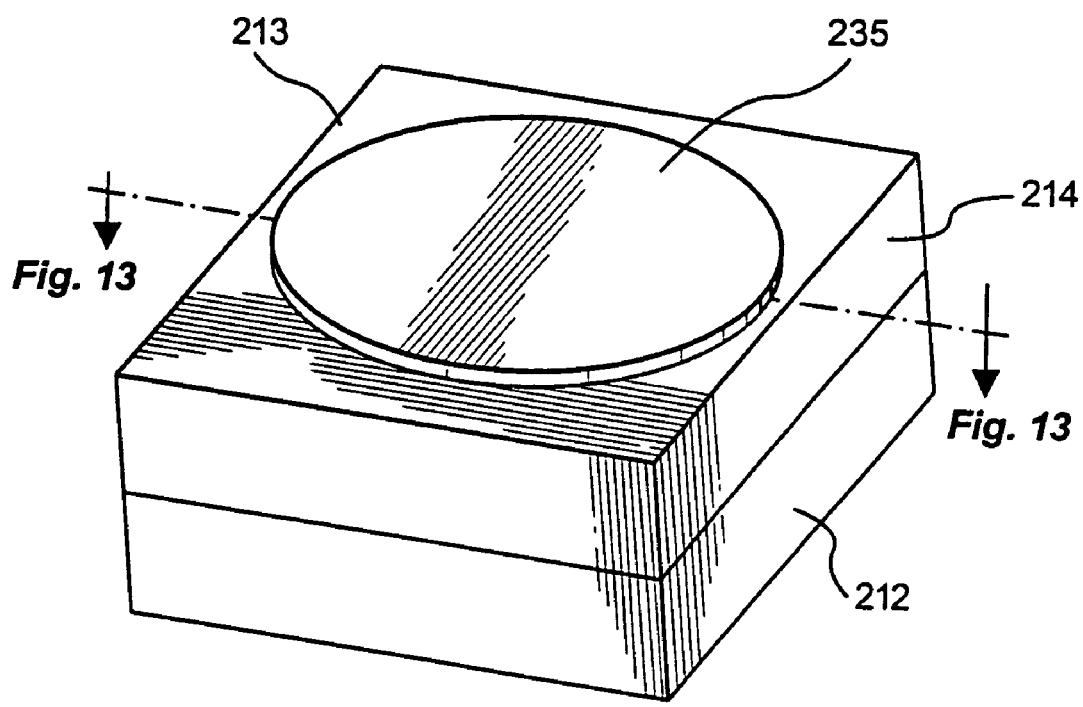
FIG. 12C is a perspective view of a single radiating element of the sub-array module.
Figure 13:
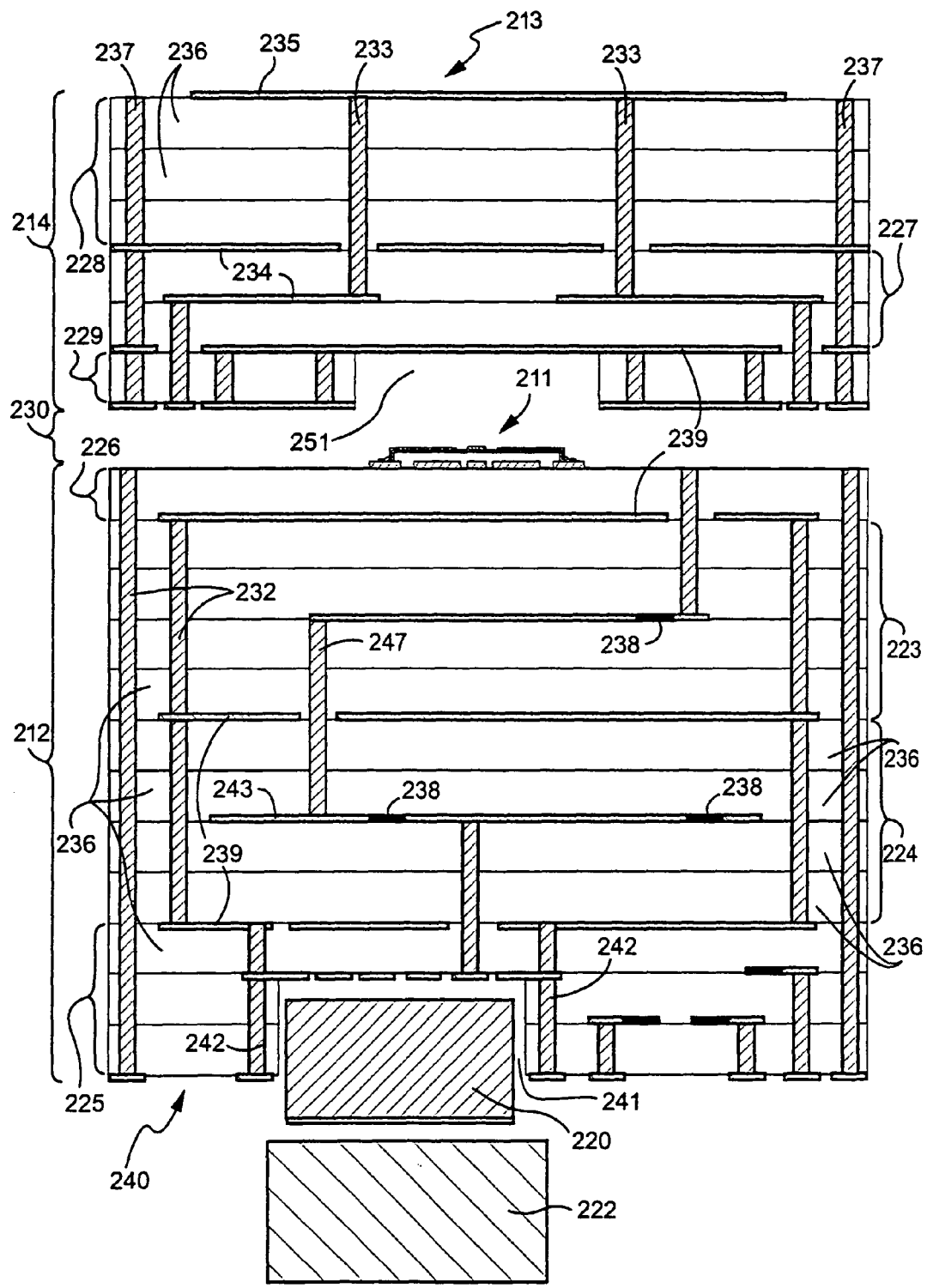
FIG. 13 is a cross-sectional view of a single radiating element of the sub-array module.

FIG. 12c illustrates a three-dimensional perspective of a single integrated radiating element 213, while FIG. 13 illustrates a cross-sectional view of the preferred embodiment of the integrated radiating element 213 of the present invention. Element 213 includes two multilayer LTCC modules 212 and 214, the layers of which form various circuit components, including at least one radiating patch, a polarizer circuit, a power divider or combiner, a band pass filter and vertical interconnects. The preferred dielectric medium for implementing these components is low-temperature cofired ceramic, or LTCC, which allows multilayer processing, and thus facilitates the vertical integration and multilevel electrical connection of the component layers and devices at the processing stage.

Although LTCC is the preferred dielectric medium for the present invention, it is also possible to use high temperature co-fired ceramic ("HTCC") for the dielectric medium. The number of circuit elements in each radiating element 213 depends on the frequency, performance, maximum package size, and system and power distribution requirements of the phased-array antenna system. The level of integration depends on the size of the antenna and complexity of the antenna requirements.

Radiating element 213 also includes at least one MEMS-based phase-shifter 215 that is fabricated on LTCC module 212. A four bit phase shifter typically occupies an area of $\lambda/2 \times \lambda/2$, where $\lambda$ is the wavelength at the center frequency of operation. If the phase-shifter 211 is fabricated in an environment with $\epsilon_{eff}=3.0$ (where $\epsilon_{eff}$ is the effective dielectric constant seen by the propagating microwave signal), a die area of approximately $3.0 \times 3.0$ mm$^2$ is required. Minimization of the die area is very important to lower the cost of the overall antenna system, since the packaged phased-shifters are typically the most expensive component of such a system. The choice of the number of bits in phase-shifter 211 will depend on the scanning step, the element-to-element spacing and the scanning range. Because of the requirements of wide angle scanning, one phase shifter per radiating element is needed to avoid the formation of grating lobes.

The vertical integration benefits of LTCC technology and the low-loss MEMS switches are crucial for achieving the low-cost, phased-array antenna system 210 of the present invention. Despite recent developments in LTCC processing (for example, photolithographic patterning of conductor/dielectric layers, zero-shrink processes that lower the shrinkage in the X-Y plane more than one order of magnitude, and various new dielectric and magnetic layers) the preferred design flow of the present invention employs only techniques currently available in the mainstream of LTCC processing. However, use of the recent developments in LTCC processing can increase dimensional control and device density, and decrease the volume and reduce the cost of fabrication even further.

The process used to make each radiating element 213 of antenna system 210 is the same as that shown in FIG. 4. According to the process of the present invention, the two multilayer ceramic modules 212 and 214 are formed using the standard LTCC process 40. The standard LTCC process flow is illustrated in FIG. 5. After the surface preparation on the module 212, MEMS components are formed on the frontside of the module as at step 41 in FIG. 4. And, as at step 42, the ceramic modules 212 and 214 are bonded, forming hermetically sealed cavities, in which the MEMS components 211 are located. The bonding of modules 212 and 214 can be performed in a controlled environment to achieve the hermetically sealed cavity: operation in this cavity improves the operation of the MEMS devices. Finally, after standard processing, as at step 43 in FIG. 4, digital/analog IC chips 220 are preferably flip-chip or wire bonded, just as at step 45 in FIG. 4, to the backside of module 212. Ceramic module 212 serves as the integration and packaging medium for ICs 220. At this step, if necessary, thermal spreaders 222 (see FIG. 13) are mounted on ICs 220 as well.

Ceramic module 212 is the substrate on which the MEMS devices are fabricated, and the other module 214 is the top cover of the hermetically sealed cavity formed by the bonding of modules 212 and 214. From the point of view of the phased-array antenna, the layer 230 that contains the MEMS components 211 is nothing more than one of many device layers that make up the overall architecture of radiating element 213. This layer, which includes MEMS components and transmission lines, is referred as the phase-shifter layer 211. Other circuit component layers 223–229 are formed in the ceramic modules 212 and 214.

The two multilayer LTCC modules 212 and 214 forming element 213 are formed and fired separately, again using the standard LTCC fabrication process shown in FIG. 5. The patterning of layers is performed, as at step 110 of FIG. 5. Via holes are opened as at step 112 of FIG. 5 and filled as at step 114 with conductor inks. This again allows construction of multiple layers, as at step 116, forming the radiating elements 213 of integrated phased-array antenna 210 in one package, as shown in FIG. 13. The process of FIG. 5 again eliminates all the packaging issues regarding the passive layers such as power dividers, couplers and radiating elements. It is also possible to obtain large numbers of antennas from a single LTCC plate. The LTCC technology allows the integration and packaging of all the device layers necessary for the phased-array antenna 210, except one layer, i.e., the phase-shifter layer 211.

The phase shifters 211 are fabricated directly on layer 226 of LTCC module 212. Minimum features (as small as 1 μm) required at phase-shifter 211 are considerably smaller than what can be achieved (>100 μm) by using screen-printing techniques. Therefore, the surface of buffer layer 226 must be prepared for photolithography steps. The minimum feature achievable using lithographic patterning on LTCC with an unprepared surface is about 20 μm. To overcome this limitation, the present invention uses special surface preparation techniques, such as chemical-mechanical polishing, combined with thin-film deposition technology, photolithography and etching technologies to obtain the required resolution of microdevices on LTCC layer 226. Phase shifter 211 is then packaged when modules 212 and 214 are bonded together and cover layer 229 in module 214 is placed on top of phase shifter 211.

Figure 14A:
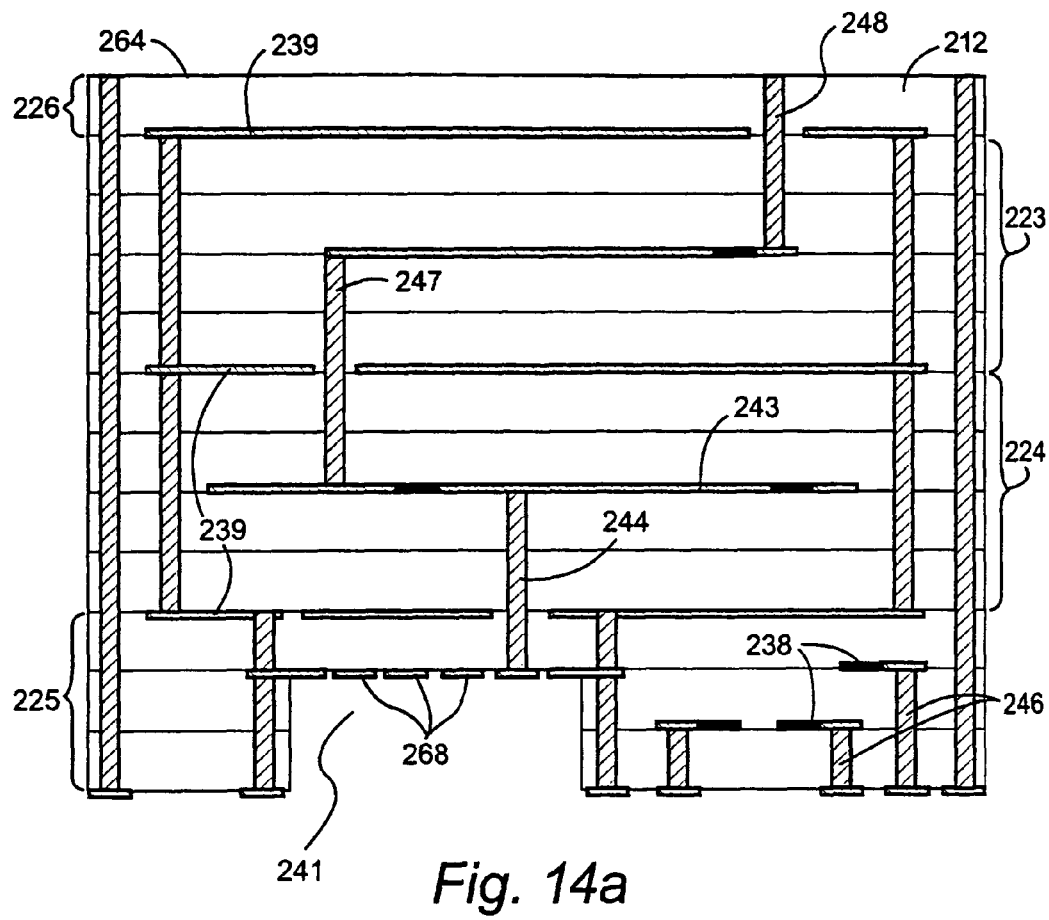
FIG. 14A illustrates a cross-sectional view of the LTCC module that supports the MEMS phase shifters.
Figure 14B:
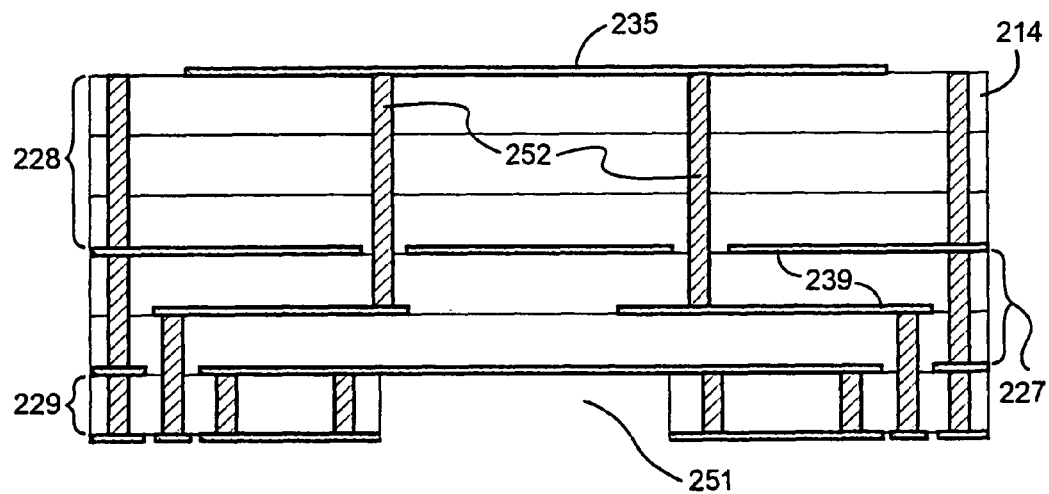
FIG. 14B illustrates a cross-sectional view of the LTCC module that covers the MEMS phase shifters.

Both modules 212 and 214 include numerous vertical connections 232 and screen-printed conducting layers 234 between the dielectric layers 236 comprising each element 213 of antenna 210. The vertical connections 232 are preferably metal-filled via connections. To minimize coupling between different device layers, stripline topology is preferred for the electrical devices 223, 224 and 227 fabricated in the internal layers of modules 212 and 214. As shown in FIGS. 14a and 14b, fabricated in the device layers forming each element 213 of phased-array antenna 210 are a power divider 223, filters 224, polarizers 227, radiating layers 228 with radiating patches 233 on top of layers 228, and phase-shifters 211. The power divider 223 divides power from a single power amplifier into many radiating elements in the transmitting antenna or combines received power from several elements. The filters 224 minimize the interference from and to other communication bands. The polarizers 227 control the polarization of the transmitted/received signals. The radiating layers 228 and radiating patches 233 transmit/receive electromagnetic signals, and the phase-shifters 211 control the phase-shift for individual radiating elements. In the preferred embodiment of the invention, the filter and power divider device layers 223 and 224 are formed in the bottom module 212. The MEMS-based phase-shifter is fabricated on module 212, and the radiating layers 228 and patches 233, and polarizer components 227 are in the top module 214. Also included in radiating layers 228 are vertical ground shields 237 for shielding between the radiating elements 233/235 in the multiple antennas 210 forming an entire phased-array antenna system.

It is well known in microwave theory that different devices have different characteristic impedance requirements. For example, a traditional Wilkinson power divider requires a 100 ohm isolation resistor and quarter-wavelength-long transmission lines with characteristic impedance of 70.7 ohm. Similarly, branch-line couplers require transmission lines with the characteristic impedance of 35.4 ohms and termination resistors of 50 ohms. The termination resistors can again be fabricated either in the internal layers of module 212, such as "buried in" resistors 238 shown in FIG. 13, or located on a surface where they can be trimmed to higher accuracy.

The screen-printed or photo patterned layers 234 are buried metal patterns which are used to define interconnections and passive microwave devices, such as transmission lines, couplers, dividers, etc. The characteristic impedance of the transmission lines is again preferably controlled to be in the range of 30 ohms to 100 ohms. This can again be done by controlling the thickness of the ceramic dielectric layers 236 and/or the width of the signal conductor following well known formulas available in the literature for variety of transmission line configurations. Preferably, the material system used for dielectric layers 236 is 943 Green Tape™, which allows the unacceptable losses of LTCC materials at higher frequencies (20 GHz and above) to be avoided. Using the Dupont 943 material system to form LTCC modules 212 and 214 allows low characteristic impedance values (<40 ohm) to be obtained, if the signal plane is separated from top and bottom ground planes 239 (for symmetric stripline configuration) with a single dielectric material. Device layers 223 and 224 shown in FIG. 14a again illustrate cross-sectional views of symmetric stripline configurations. The stripline in 224 consists of three conductive planes: two of them ground planes 239 and a signal plane 243 in the middle. Vertical connections 244 and 247 connects signal planes 243 from one device to another one by going through the ground planes. As can be seen, two dielectric tape layers 236 are used to separate the signal plane 243 from ground planes 239. Based-on the limitations on minimum patternable conductor width, high impedance values (>60 ohms) may require more than one LTCC layer on both sides of signal plane 243. If the minimum line width is around 100 μm, then two dielectric layers 236 have to be used on both sides of signal plane 243.

As shown in FIG. 13, in the preferred embodiment of the invention each of the microwave device layers 223 and 224 in module 212 is formed using four layers of 943 dielectric tape 236. Of course, the number of layers needed would change if a different dielectric with different properties and thicknesses were used.

A stripline transmission line configuration is preferable for the vertical connections 232, because ground planes 239 on both sides of the stripline circuits help minimize the interference between circuits in the different layers 223, 224 and 227. Therefore, the electromagnetic isolation between the vertical circuits is easier to achieve. In addition, the stripline configuration has a homogeneous dielectric medium, which lowers signal dispersion.

Other transmission line configurations, such as shielded-coplanar transmission lines, can be used in the internal device layers 223, 224 and 227. At outer surfaces, variations of microstrip and coplanar configurations can be used. For the MEMS device layer 230, a conductor-backed coplanar configuration is preferable.

All the vertical connections 232, 233, 237 and 247 shown in FIG. 13 are the same. However, functionally, there are important differences. Vertical connections between the ground planes are not that critical for signal integrity. On the other hand, connections between the signal planes are understandably more important. Vertical connections 232 are ground connections for module 212, whereas vertical connections 233 are signal connections for module 214 in FIG. 13. The shielding for vertical connections is important if they originate from a signal plane. Thus, the vertical connections between two layers of devices 223, 224, and/or 227 can be unshielded or shielded coaxial-type connections. In both cases, the vertical connections 232 have to be designed carefully to minimize the internal reflections and losses between two layers of devices 223, 224, and/or 227.

Vertical connections 242 can be also used to shield electromagnetic interference and coupling. If there are multiple components in a single layer, grounded-vertical connections 242 placed between them will lower interference significantly. For example, looking at the bottom side 240 of module 212, integrated circuits 220 placed in the LTCC cavity 241 need to be isolated from other device layers such as 223 and 224. Vertical connections 242 embedded in the sidewalls of cavity 241 are grounded to minimize electromagnetic radiation to internal device layers, such as 223 and 224.

To maintain proper operation, ICs 220 can be flip-chip bonded to module 212. Copper thermal spreaders 222 can then be mounted directly on the backside of ICs 220, if necessary. If IC power consumption is not an issue, then low-cost wire-bonding techniques can be employed to mount low pin-count ICs 220 on module 212. Integrated circuit 220 can be any of the following: a control circuit for the MEMS phase-shifter components, a power module for such MEMS components, a microprocessor or a signal processor, a high frequency power amplifier, a high frequency low noise amplifier, high frequency down-converters, or any other analog/digital integrated circuits that are necessary for the operation of the phased-array system.

Where IC 220 in FIG. 13 is a power amplifier or a low noise amplifier ("LNA"), vertical connections can be used to isolate these devices, since they can potentially interfere with many circuit devices in radiating element 213, if special precautions are not taken. Thus, vertical connections 242 limit the interference from such ICs in the horizontal direction, whereas ground planes 239 blocks signals in the vertical direction. Such shielding measures are not necessary for low frequency and low power IC chips like logic, memory and DSP blocks.

But not every radiating element 213 requires an amplifier. The most basic advantage of the technology of the present invention is that the losses are so low that the number of amplifiers necessary to achieve a function can be reduced significantly, thereby also resulting in significant decreases in system complexity and cost with corresponding increases in system reliability. In the present invention, the size of sub-array 215 (i.e., the number of radiating elements 213 in a sub-array 215) depends on the output power level of an amplifier IC 220 and the loss of each element 213. It is possible that a single amplifier IC 220 can support 4×4=16 elements 213. In that case, a logical choice for the size of sub-array 215 would be 4×4=16 elements 213. If a power amplifier 220 can support twenty-five elements 213, the a logical choice for the size of sub-array 215 would be 5×5=25 radiating elements 213. Therefore, ideally, there is one amplifier 220 per sub-array 215. In the device layers 223 or 224 (FIG. 13), this power is divided for individual elements equally, and in layers above, including in phase shifter layer 230, the signal is processed independently in each element 213. Eventually, they are radiated via patch 235 with a certain polarization characteristic and time delay. It is the time delay that is introduced to the signal to the signal as it propagates to the radiating element and the subsequent inference of the radiated electromagnetic signal from multiple radiating elements that provides the scanning capability of the phased-array antenna 210. The phase shifter layer 230 is where a time delay is introduced to the signal prior to reaching the radiating element.

As illustrated in FIG. 14a, lower module 212 has three distinct functional areas, i.e., an interconnection layer 225, two device layers 223 and 224, and a buffer layer 226. The interconnection layer 226 is used to interconnect through connections 244 and 246 different ICs 220 and lumped components such as inductors, capacitors, and resistors 238, either discrete or formed in or on module 212. The device layers 223 and 224 are distributed or lumped, as necessary, for phased-array operation. They are connected together by a connection 247 extending between such layers. Several device layers can be integrated vertically in this section.

The buffer layer 226 is used only for connection, through a vertical connection 248, to the MEMS phase-shifters 211, which are formed on top of this layer. Since the front surface 264 of layer 226 is polished prior to the fabrication of the MEMS devices 211 on top of layer 226, no surface conductors are printed prior to polishing. In the preferred process flow, LTCC compatible bonding materials are printed and fired after polishing. However, it is possible to have one un-patterned conductor layer, which is deposited as a part of the LTCC process. In this case, the surface preparation would include metal polishing rather than ceramic polishing, and the MEMS process sequence shown in FIG. 4 must be modified accordingly.

The second module 214, as shown in FIG. 14b, also has three functional layers, i.e., a MEMS cover layer 229, at least one device layer 227, and a radiation layer 228. The MEMS cover layer 229 includes a cavity 251 for the MEMS phase-shifters 211 that enables proper packaging of the MEMS devices 211 fabricated on module 212. The device layer 227 is one or more layers of passive devices. One or more signal-feed ports 252 can be used to feed the radiating patch 235. Two ports 252 are shown in FIG. 14b. Also the bandwidth of the radiation can be improved by adding a second radiating patch (not shown) on top of main patch 235 in FIG. 14b. Typically, this second patch improves the radiation properties of the main patch by allowing better match at the input at ports 252. If the signals are 90 degrees out of phase between the input ports, this would generate a circularly polarized radiation, Again radiation properties can be changed by changing the number of ports, location of the ports, the relative phase difference between the ports and the patch pattern. These variations are well-documented in the antenna design literature and can be applied to the design of the present invention.

Surface preparation for buffer layer 226, which acts as a substrate for the fabrication of MEMS devices 211, can potentially include multiple steps such as planarization of ceramic parts, planarization of first metallization, and deposition of bonding materials. The last two items are optional because it is obvious to those skilled in the art of hermetic packaging and MEMS fabrication that there are many different ways to achieve the desired hermetically sealed cavity formed by the bonding of the two ceramic modules 212 and 214.

Surface planarization is necessary prior to MEMS fabrication due to large surface roughness of fired ceramic parts. Such planarization would be performed in a manner like that described above with respect to the other MEMS devices. Another optional step, which can be done as a part of surface preparation, is the deposition of bonding materials on the surface of buffer layer 226 prior to MEMS processing, as discussed above. Once the surface preparation is completed, the MEMS fabrication process is done using various MEMS process flows, such as that shown in FIGS. 8A–8F.

At system level, several well-known phase-shifter topologies can be used to form the phase-shifters 211 using MEMS switches and/or MEMS tunable capacitors. It is well know in the art that many topologies of MEMS switches can be used as tunable capacitors, if the applied voltage is kept below the actuation voltage. At low frequencies (<10 GHz), usually phase-shifters that employ variable (tunable) capacitors and inductors are used. Other topologies tend to have very large areas. On the other hand, at high frequencies (>10 GHz), switched-delay-line, loaded-line or reflection topologies are preferred. All these phase-shifter architectures can be built on module 212 as long as the necessary MEMS components can be built in the MEMS process of choice.

The MEMS-based phase-shifter 211 used in the antenna 210 of the present invention is preferably based on switched delay lines (not shown). The MEMS delay lines use a conductor-backed coplanar design to obtain good isolation from the other device layers. By using a thick metal conductor, losses are minimized. Total attenuation for the conductor and dielectric in the transmission lines is 1 dB/cm at 30 GHz. If 10 μm thick silver strips are used on the 943 Green Tape, losses as low as 0.2 dB/cm at 30 GHz can be obtained.

In the switched-delay line approach, the cost varies considerably with the fabrication technology. One of the reasons for this variation is that, while the system area remains almost the same, the manufacturing cost per unit area changes drastically. For example, GaAs substrates are about one order of magnitude more expensive than high-quality, non-crystalline, microwave substrates. Since the mechanical operation of MEMS switches does not depend on the type of the substrate on which they are fabricated, they can be fabricated on any substrates having sufficiently low dielectric losses at the operational frequencies, including 450× 450 mm large LTCC panels, as opposed to costly 100 mm or 150 mm GaAs substrates. In addition, at least seven masks with features as small as 0.7 um are necessary for Monolithic Microwave Integrated Circuit ("MMIC")-based phase-shifters. Not only does GaAs processing require more steps, but also each processing step is more expensive to perform. This is especially true of an MMIC process with ground vias, which are necessary for low noise operation and which increase the unit area cost of GaAs substantially. On the other hand, ground vias are readily available in LTCC panels. The number of masks necessary for device fabrication is 4–6 and the minimum feature is around 1.0 um.

To prevent stiction between contact surfaces of MEMS switch, and to maintain low-resistance contacts in switches, surface treatments are necessary to avoid contamination and unwanted chemical reactions, such as oxidation. Commercially available anti-stiction coatings, such as the dichlorodimethylsilane (DDMS) monolayer, the octadecyltrichlorosilane (OTS) self-assembled monolayer, or similar products can be used on the metal surfaces to minimize any unintentional adhesion in mechanical switches or other contacting or near-contacting surfaces within the present invention.

The MEMS processing can be performed on large-area-processing (LAP) equipment (not shown). This equipment, like LTCC processing tools, can handle very large panels (or wafers). The current generation of the LAP tools has the capability of processing panels larger than 800×800 mm and capable of handling minimum features as small as 2 μm or less. On the other hand, current generation of LTCC manufacturing tools can process only 200×200 mm panels, though it is straightforward for sizes to 800×800 mm and beyond.

The MEMS fabrication is followed by the bonding of the two LTCC modules 212 and 214 at low pressure and in a low-humidity environment. If other bonding techniques were used, the necessary surface preparation would precede the selected bonding process. The bonding of modules 212 and 214 is then followed by the integration of ICs 220 and other discrete components (not shown) on the backside of module 212 (see FIG. 13). For this purpose, flip-chip bonding is more reliable and repeatable, and lends itself to better thermal management options, as described below. Therefore, especially high-power, high-frequency ICs 220 are preferably flip-chip bonded in shielded cavities 241 in module 212 to minimize the electromagnetic coupling to other sensitive circuits and to achieve better heat removal from the backside of ICs 220. ICs 220 can be analog or digital ICs, MMICs and/or Radio Frequency Integrated Circuits ("RFICs").

The quality of flip-chip bonds are assessed by determining the detuning of the circuits due to their proximity to ceramic module 212, the reflection due to transition, and the insertion loss at each connection. Typically, the size of the pads 268 (seen in FIG. 14a) and the metal extensions are preferably selected to be as small as possible to minimize parasitic capacitances. The height of the pads 268 is typically chosen to be larger than one third of ground-to-ground spacing on the 50 Ω CPW lines on chip to minimize the detuning. By careful placement of contact pads 268, and if necessary, inductive compensation, a return loss above 25 dB at 40 GHz and an insertion loss of less than 0.25 dB can be achieved.

Dupont 943 dielectric tape has thermal conductivity of ~5 W/mK. This conductivity can be further improved by using conductor-filled thermal vias 232. It has been shown that with proper thermal design, it is possible to obtain thermal conductivities close to those of costly Beryllium Oxide ("BeO") and Aluminum Nitride ("AlN") (>250 W/mK) substrates. Here, thermal spreaders 222 are mounted on the backside of the flip-chip bonded ICs 220. If the depth of the cavity 241 is the same as the thickness of ICs 220, the thermal spreader 222 will function as an electromagnetic shield too.

Similarly, other front end components can be improved using MEMS components embedded in LTCC as well, including radiating patches. Although patch 235 described herein is fixed in size, the present invention allows the alteration of the physical shape of the radiating patch seen by electromagnetic signals. RF filters (constructed based on LC networks shown in FIG. 11a) benefit from the technology in the present invention as well. For example, extremely functional filters can be realized on LTCC whereby the filtering characteristics can be altered as desired under electronic control. Voltage controlled oscillators would benefit from this technology, because it would provide excellent tunable capacitors and inductors in the same package. Mixers are the remaining critical component in the front-end of communication networks. Significant functionality increases can be achieved for the mixers as well using the present invention.

Although the present invention has been described in terms of a particular embodiment and process, it is not intended that the invention be limited to that embodiment. Modifications of the embodiment and process within the spirit of the invention will be apparent to those skilled in the art. The scope of the invention is defined by the claims that follow.

What is claimed is:

1. A method of forming a radio frequency ("RF") device including at least one MEMS device comprising the steps of:
   fabricating a first module from a first plurality of low-temperature co-fired ceramic ("LTCC") layers, the first plurality of layers forming at least a first circuit used in the operation of the MEMS device;
   fabricating a second module from a second plurality of low-temperature co-fired ceramic ("LTCC") layers, the second plurality of layers forming at least a second circuit used in the operation of the MEMS device;
   polishing a surface of a front layer of the first module to be used as a substrate after fabrication of the first module is completed;
   fabricating on the front layer the at least one MEMS device using MEMS processing; and
   bonding the first and second modules together to thereby form a cavity containing the at least one MEMS device.

2. The method of forming a RF device as recited in claim 1 further comprising the steps of polishing a surface of a back layer of the second module to be used as a cover after fabrication of the second module is completed and applying two-component brazing materials on the front and back layers prior to bonding the first and second modules together.

3. The method of forming a RF device as recited in claim 2 wherein the step of polishing the surfaces of the front and back layers is performed using a mechanical or chemical/mechanical polish.

4. The method of forming a RF device as recited in claim 1 wherein the step of bonding the first and second modules together is performed using eutectic bonding.

5. The method of forming a RF device as recited in claim 1 wherein the step of bonding the first and second modules together is performed using an insulating layer such as glass-frit.

6. The method of forming a RF device as recited in claim 1 wherein the step of bonding the first and second modules together is performed using an insulating layers such as a thermalsetting polyimide film.

7. The method of forming a RF device as recited in claim 1 wherein the step of applying two-component brazing materials on the front and back layers comprises the steps of:
   depositing a plurality of first contact pads on a front layer of the first module;
   planarizing the front layer of the first module;
   depositing an adhesion layer and a soldering conductor on the first contact pads;
   firing the first module at a temperature greater than 800° C.;
   depositing a plurality of second contact pads on a back layer of the second module;
   planarizing the back layer of the second module;
   depositing an adhesion layer and a soldering conductor on the second contact pads; and
   firing the first module at a temperature greater than 800° C.

8. The method of forming a RF device as recited in claim 1 wherein the step of polishing the surfaces of the front and back layers is performed using a mechanical or chemical/mechanical polish.

9. The method of forming a RF device as recited in claim 1 wherein the step of bonding the first and second modules together is performed at low pressure and in a low-humidity environment.

10. The method of forming a RF device as recited in claim 1 wherein the step of bonding the first and second modules together is performed in an inert gas atmosphere.

11. The method of forming a RF device as recited in claim 1 wherein the first and second modules are bonded together to thereby form a hermetically sealed cavity containing the at least one MEMS device.

12. The method of forming a RF device as recited in claim 1 wherein the step of fabricating the MEMS device comprises forming a switch.

13. The method of forming a RF device as recited in claim 1 further comprising the step of forming vertical interconnects extending through the first and second pluralities of LTCC layers.

14. The method of forming a RF device as recited in claim 1 further comprising the step of forming in the first plurality of LTCC layers a buffer layer that is a substrate on which the at least one MEMS device is fabricated.

15. The method of forming a RF device as recited in claim 1 further comprising the step of bonding to one of the first plurality of LTCC layers at least one integrated circuit.

16. The method of forming a RF device as recited in claim 15 further comprising the step of forming in the first plurality of LTCC layers an interconnect layer for interconnecting the integrated circuit to the MEMS device.

17. The method of forming a RF device as recited in claim 15 further comprising the step of flip-chip bonding the integrated circuits to screen-printed surface metal patterns on a layer of the first plurality of LTCC layers.

18. The method of forming a RF device as recited in claim 15 further comprising the step of wire-bonding the integrated circuits to screen-printed surface metal patterns on a layer of the first plurality of LTCC layers.

19. The method of forming a RF device as recited in claim 15 further comprising the step of flip-chip bonding the integrated circuits to photo-patterned surface metal patterns on a layer of the first plurality of LTCC layers.

20. The method of forming a RF device as recited in claim 15 further comprising the step of wire-bonding the integrated circuits to photo-patterned surface metal patterns on a layer of the first plurality of LTCC layers.

21. The method of forming a RF device as recited in claim 1 further comprising the step of fabricating in the first plurality of LTCC layers a plurality of buried-in discrete components.

22. The method of forming a RF device as recited in claim 21 wherein the discrete components include at least one device from the group consisting of resistors, capacitors and inductors.

23. The method of forming a RF device as recited in claim 1 further comprising the step of forming in the first and second pluralities of LTCC layers screen-printed buried metal patterns that are used to define interconnections and passive microwave devices.

24. The method of forming a RF device as recited in claim 23 wherein the passive microwave devices include at least one device from the group consisting of transmission lines, couplers, and dividers.

25. The method of forming a RF device as recited in claim 1 further comprising the step of forming in the first and second pluralities of LTCC layers photo-patterned buried metal patterns that are used to define interconnections and passive microwave devices.

26. The method of forming a RF device as recited in claim 25 wherein the passive microwave devices include at least one device from the group consisting of transmission lines, couplers, and dividers.

27. The method of forming a RF device as recited in claim 1 further comprising the step of forming in the second plurality of LTCC layers ground shielding extending through said layers to shield the at least one MEMS device from radiating.

28. The method of forming a RF device as recited in claim 1 wherein the MEMS process is performed in large-area-processing tools or standard semiconductor tools.

29. A method of forming an electrical device comprising the steps of:
fabricating a first module from a first plurality of low-temperature co-fired ceramic ("LTCC") layers, the first plurality of layers forming at least a first circuit used in the operation of the electrical device;
fabricating a second module from a second plurality of low-temperature co-fired ceramic ("LTCC") layers, the second plurality of layers forming at least a second circuit used in the operation of the electrical device;
polishing a surface of a front layer of the first module to be used as a substrate after fabrication of the first module is completed;
fabricating on the front layer at least one microelectro-mechanical device ("MEMS") using standard MEMS processing; and
bonding the first and second modules together to thereby form a cavity containing the at least one MEMS device.

30. The method of forming an MEMS device as recited in claim 29 further comprising the steps of polishing a surface of a back layer of the second module to be used as a cover after fabrication of the second module is completed and applying two-component brazing materials on the front and back layers prior to bonding the first and second modules together.

31. The method of forming a MEMS device as recited in claim 29 wherein the step of bonding the first and second modules together is performed using eutectic bonding.

32. The method of forming a MEMS device as recited in claim 29 wherein the step of bonding the first and second modules together is performed using an insulating layer such as glass-frit.

33. The method of forming a MEMS device as recited in claim 29 wherein the step of bonding the first and second modules together is performed using an insulating layers such as a thermal setting polyimide film.

34. The method of forming an electrical device as recited in claim 29 wherein the step of applying two-component brazing materials on the front and back layers comprises the steps of:
depositing a plurality of first contact pads on a front layer of the first module;
planarizing the front layer of the first module;
depositing an adhesion layer and a soldering conductor on the first contact pads;
firing the first module at a temperature greater than 800° C.;
depositing a plurality of second contact pads on a back layer of the second module;
planarizing the back layer of the second module;
depositing an adhesion layer and a soldering conductor on the second contact pads; and
firing the first module at a temperature greater than 800° C.

35. The method of forming an electrical device as recited in claim 29 wherein the step of polishing surfaces of the front and back layers is performed using a mechanical or chemical/mechanical polish.

36. The method of forming an electrical device as recited in claim 29 wherein the step of bonding the first and second modules together is performed at low pressure and in a low-humidity environment.

37. The method of forming an electrical device as recited in claim 29 wherein the first and second modules are bonded together to thereby form a hermetically sealed cavity containing the at least one MEMS device.

38. The method of forming an electrical device as recited in claim 29 further comprising the step of forming vertical interconnects extending through the first and second pluralities of LTCC layers.

39. The method of forming an electrical device as recited in claim 38 wherein the vertical interconnects are metal-filled vias.

40. The method of forming an electrical device as recited in claim 29 further comprising the step of bonding to one of the first plurality of LTCC layers at least one integrated circuit.

41. The method of forming an electrical device as recited in claim 40 further comprising the step of forming in the first plurality of LTCC layers an interconnect layer for interconnecting the integrated circuit to the electrical device.

42. The method of forming an electrical device as recited in claim 29 further comprising the step of fabricating in the first plurality of LTCC layers a plurality of buried-in discrete components.

43. The method of forming an electrical device as recited in claim 29 wherein the MEMS process is performed in large-area-processing tools or standard semiconductor tools.

44. A method of forming a radiating element for an array antenna comprising the steps of:
fabricating a first module from a first plurality of low-temperature co-fired ceramic ("LTCC") layers, the first plurality of layers forming at least a first circuit used in the operation of the array antenna;

fabricating a second module from a second plurality of low-temperature co-fired ceramic ("LTCC") layers, the second plurality of layers forming at least a second circuit used in the operation of the array antenna;

polishing a surface of a front layer of the first module to be used as a substrate after fabrication of the first module is completed;

fabricating on the front layer at least one microelectromechanical switch ("MEMS") using MEMS processing; and bonding the first and second modules together to thereby form a cavity containing the at least one MEMS switch.

45. The method of forming a radiating element for an array antenna as recited in claim 44 further comprising the steps of polishing a surface of a back layer of the second module to be used as a cover after fabrication of the second module is completed and applying two-component brazing materials on the front and back layers prior to bonding the first and second modules together.

46. The method of forming a radiating element for an array antenna as recited in claim 45 wherein the step of polishing the surfaces of the front and back layers is performed using a mechanical or chemical/mechanical polish.

47. The method of forming a radiating element for an array antenna as recited in claim 45 wherein the step of bonding the first and second modules together is performed using eutectic bonding.

48. The method of forming a radiating element for an array antenna as recited in claim 44 wherein the step of bonding the first and second modules together is performed using an insulating layer such as glass-frit.

49. The method of forming a radiating element for an array antenna as recited in claim 44 wherein the step of bonding the first and second modules together is performed using an insulating layers such as a thermalsetting polyimide film.

50. The method of forming a radiating element for an array antenna as recited in claim 44 wherein the step of applying two-component brazing materials on the front and back layers comprises the steps of:

depositing a plurality of first contact pads on a front layer of the first module;

planarizing the front layer of the first module;

depositing an adhesion layer and a soldering conductor on the first contact pads;

firing the first module at a temperature greater than 800° C.;

depositing a plurality of second contact pads on a back layer of the second module;

planarizing the back layer of the second module; (optional)

depositing an adhesion layer and a soldering conductor on the second contact pads; and firing the first module at a temperature greater than 800° C.

51. The method of forming a radiating element for an array antenna as recited in claim 50 wherein the step of polishing the surfaces of the front and back layers is performed using a selectively protective and removable layer on exposed metal during polishing to prevent or reduce dishing.

52. The method of forming a radiating element for an array antenna as recited in claim 44 wherein the step of polishing the surfaces of the front and back layers is performed using a mechanical or chemical/mechanical polish.

53. The method of forming a radiating element for an array antenna as recited in claim 44 wherein the step of bonding the first and second modules together is performed at low pressure and in a low-humidity environment.

54. The method of forming a radiating element for an array antenna as recited in claim 53 further comprising the step of forming in the second plurality of LTCC layers ground shielding extending through said layers to shield the at least one radiating patch from radiating patches in other array antennas.

55. The method of forming a radiating element for an array antenna as recited in claim 44 wherein the step of bonding the first and second modules together is performed in an inert gas atmosphere.

56. The method of forming a radiating element for an array antenna as recited in claim 44 wherein the first and second modules are bonded together to thereby form a hermetically sealed cavity containing the at least one MEMS switch.

57. The method of forming a radiating element for an array antenna as recited in claim 44 wherein the MEMS switch is a phase shifter.

58. The method of forming a radiating element for an array antenna as recited in claim 44 further comprising the step of forming vertical interconnects extending through the first and second pluralities of LTCC layers.

59. The method of forming a radiating element for an array antenna as recited in claim 44 further comprising the step of forming a polarizer circuit in the second plurality of LTCC layers.

60. The method of forming a radiating element for an array antenna as recited in claim 44 further comprising the step of forming a power divider circuit and a band pass filter circuit in the first plurality of LTCC layers.

61. The method of forming a radiating element for an array antenna as recited in claim 44 further comprising the step of forming in the first plurality of LTCC layers a buffer layer that is a substrate on which the at least one MEMS phase shifter is fabricated.

62. The method of forming a radiating element for an array antenna as recited in claim 44 further comprising the step of bonding to one of the first plurality of LTCC layers at least one integrated circuit.

63. The method of forming a radiating element for an array antenna as recited in claim 62 further comprising the step of forming in the first plurality of LTCC layers an interconnect layer for interconnecting the integrated circuit to the array antenna.

64. The method of forming a radiating element for an array antenna as recited in claim 63 further comprising the step of flip-chip bonding the integrated circuits to screen-printed surface metal patterns on a layer of the first plurality of LTCC layers.

65. The method of forming a radiating element for an array antenna as recited in claim 63 further comprising the step of wire-bonding the integrated circuits to screen-printed surface metal patterns on a layer of the first plurality of LTCC layers.

66. The method of forming a radiating element for an array antenna as recited in claim 63 further comprising the step of flip-chip bonding the integrated circuits to photo-patterned surface metal patterns on a layer of the first plurality of LTCC layers.

67. The method of forming a radiating element for an array antenna as recited in claim 63 further comprising the step of wire-bonding the integrated circuits to photo-patterned surface metal patterns on a layer of the first plurality of LTCC layers.

68. The method of forming a radiating element for an array antenna as recited in claim 44 further comprising the step of forming in the second plurality of LTCC layers a plurality of radiating layers with at least one radiating patch fabricated on one of the radiating layers.

69. The method of forming a radiating element for an array antenna as recited in claim 44 further comprising the step of fabricating in the first plurality of LTCC layers a plurality of buried-in discrete components.

70. The method of forming a radiating element for an array antenna as recited in claim 69 wherein the discrete components are resistors, capacitors, and/or inductors.

71. The method of forming a radiating element for an array antenna as recited in claim 44 further comprising the step of forming in the first and second pluralities of LTCC layers screen-printed buried metal patterns that are used to define interconnections and passive microwave devices.

72. The method of forming a radiating element for an array antenna as recited in claim 71 wherein the passive microwave devices include at least one device from the group consisting of transmission lines, couplers, and dividers.

73. The method of forming a radiating element for an array antenna as recited in claim 44 further comprising the step of forming in the first and second pluralities of LTCC layers photo-patterned buried metal patterns that are used to define interconnections and passive microwave devices.

74. The method of forming a radiating element for an array antenna as recited in claim 73 wherein the passive microwave devices include at least one device from the group consisting of transmission lines, couplers, and dividers.

75. The method of forming a radiating element for an array antenna as recited in claim 74 wherein the at least one MEMS switch contained in the hermetically sealed cavity is coated with a surface treatment to prevent stiction.

76. The method of forming a radiating element for an array antenna as recited in claim 75 wherein the at least one MEMS switch is coated with a surface treatment selected from the group consisting of dichlorodimethylsilane (DDMS) monolayer and octadecyltrichlorosilane (OTS) self-assembled monolayer.

77. The method of forming a radiating element for an array antenna as recited in claim 44 wherein the MEMS process is performed in large-area-processing tools or standard semiconductor tools.

78. The method of forming a radiating element for an array antenna as recited in claim 44 wherein the at least one MEMS switch is sealed with a surface treatment to prevent stiction.

79. The method of forming a radiating element for an array antenna as recited in claim 78 wherein the at least one MEMS switch is sealed with a surface treatment selected from the group consisting of dichlorodimethylsilane (DDMS) monolayer and octadecyltrichlorosilane (OTS) self-assembled monolayer.

80. The method of forming a radiating element for an array antenna as recited in claim 78 wherein the at least one MEMS switch is sealed with a product that can be used on metal surfaces to minimize unintentional adhesion in mechanical switches or other contacting or near-contacting surfaces.

81. The method of forming a radiating element for an array antenna as recited in claim 44 wherein the at least one MEMS switch is sealed with a surface treatment to prevent stiction and maintain low-resistance contacts in the at least one MEMS switch by avoiding contamination and unwanted chemical reactions, such as oxidation.

82. A method of forming an array antenna comprising the steps of:
fabricating a plurality of radiating elements, each of the radiating elements being fabricated by forming at least one microelectromechanical ("MEMS") switch on a first low-temperature co-fired ceramic ("LTCC") module, and bonding a second LTCC module to the first LTCC module, whereby the MEMS switch is located in a cavity between the first and second LTCC modules;
forming a plurality of sub-array modules, each of the sub-array modules being formed from a plurality of radiating elements;
integrating the plurality of sub-array modules together to form the phased array antenna; and
connecting the plurality of sub-array modules to at least one amplifier.

83. A method of forming an electrical device comprising the steps of:
fabricating a first module from a first plurality of low-temperature co-fired ceramic ("LTCC") layers, the first plurality of layers forming at least a first circuit used in the operation of the electrical device;
fabricating a second module from a second plurality of low-temperature co-fired ceramic ("LTCC") layers, the second plurality of layers forming at least a second circuit used in the operation of the electrical device;
polishing a surface of a front layer of the first module to be used as a substrate after fabrication of the first module is completed;
fabricating on the front layer at least one microelectromechanical device ("MEMS") using standard MEMS processing; and
bonding the first and second modules together to thereby form a cavity containing the at least one MEMS device.

84. The method of forming an array antenna as recited in claim 83 further comprising the steps of polishing a surface of a back layer of the second module to be used as a cover after fabrication of the second module is completed and applying two-component brazing materials on the front and back layers prior to bonding the first and second modules together.

85. The method of forming an array antenna as recited in claim 83 wherein the step of bonding the first and second modules together is performed using eutectic bonding.

86. The method of forming an array antenna as recited in claim 83 wherein the step of bonding the first and second modules together is performed using an insulating layer such as glass-frit.

87. The method of forming an array antenna as recited in claim 83 wherein the step of bonding the first and second modules together is performed using an insulating layers such as a thermal setting polyimide film.

88. The method of forming an electrical device as recited in claim 83 wherein the step of applying two-component brazing materials on the front and back layers comprises the steps of:
depositing a plurality of first contact pads on a front layer of the first module;
planarizing the front layer of the first module;
depositing an adhesion layer and a soldering conductor on the first contact pads;
firing the first module at a temperature greater than 800° C.;

depositing a plurality of second contact pads on a back layer of the second module;

planarizing the back layer of the second module;

depositing an adhesion layer and a soldering conductor on the second contact pads; and firing the first module at a temperature greater than 800° C.

89. The method of forming an electrical device as recited in claim 83 wherein the step of polishing surfaces of the front and back layers is performed using a mechanical or chemical/mechanical polish.

90. The method of forming an electrical device as recited in claim 83 wherein the step of bonding the first and second modules together is performed at low pressure and in a low-humidity environment.

91. The method of forming an electrical device as recited in claim 83 wherein the first and second modules are bonded together to thereby form a hermetically sealed cavity containing the at least one MEMS device.

92. The method of forming an electrical device as recited in claim 83 further comprising the step of forming vertical interconnects extending through the first and second pluralities of LTCC layers.

93. The method of forming an electrical device as recited in claim 92 wherein the vertical interconnects are metal-filled vias.

94. The method of forming an electrical device as recited in claim 83 further comprising the step of bonding to one of the first plurality of LTCC layers at least one integrated circuit.

95. The method of forming an electrical device as recited in claim 94 further comprising the step of forming in the first plurality of LTCC layers an interconnect layer for interconnecting the integrated circuit to the electrical device.

96. The method of forming an electrical device as recited in claim 83 further comprising the step of fabricating in the first plurality of LTCC layers a plurality of buried-in discrete components.

97. The method of forming an electrical device as recited in claim 83 wherein the MEMS process is performed in large-area-processing tools or standard semiconductor tools.

* * * * *